United States Patent
Lesso

(10) Patent No.: US 10,348,282 B1
(45) Date of Patent: Jul. 9, 2019

(54) MODULATORS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/050,762

(22) Filed: Jul. 31, 2018

(51) Int. Cl.
 H03K 5/135 (2006.01)
 H03K 5/14 (2014.01)
 H03K 5/131 (2014.01)

(52) U.S. Cl.
 CPC ............. *H03K 5/135* (2013.01); *H03K 5/131* (2013.01); *H03K 5/14* (2013.01)

(58) Field of Classification Search
 None
 See application file for complete search history.

(56) References Cited

U.S. PATENT DOCUMENTS

| 7,532,082 | B2 * | 5/2009 | Clara | H03F 3/2173 |
| | | | | 332/109 |
| 8,212,700 | B2 * | 7/2012 | Zoso | H03M 3/422 |
| | | | | 341/143 |

| 2006/0187099 | A1 | 8/2006 | Fujimoto |
| 2008/0169953 | A1 | 7/2008 | Yamamoto et al. |

FOREIGN PATENT DOCUMENTS

WO    2004105251 A1    12/2004

OTHER PUBLICATIONS

Combined Search and Examination Report under Sections 17 and 18(3), UKIPO, Application No. GB1813804.0, dated Feb. 15, 2019.

* cited by examiner

*Primary Examiner* — Jeffery S Zweizig
(74) *Attorney, Agent, or Firm* — Jackson Walker L.L.P.

(57) ABSTRACT

This application relates to time-encoding modulators (TEMs). A TEM (100) receives an input signal ($S_{IN}$) and outputs a time encoded signal ($S_{PWM}$). A comparator (101) is located within a forward signal path of a feedback loop of the TEM. Also in the feedback loop are a filter (104) and a delay element (106) for applying a controlled delay. In some embodiments a latching element (101, 302; 106, 402) is located within the forward signal path to synchronize any signal transitions output from the latching element to a received first clock signal. Any signal transitions in the output ($S_{OUT}$) from the modulator are thus synchronized to the first clock signal. In some embodiments the delay element (106) is a digital delay element which is synchronized to the first clock signal.

24 Claims, 10 Drawing Sheets

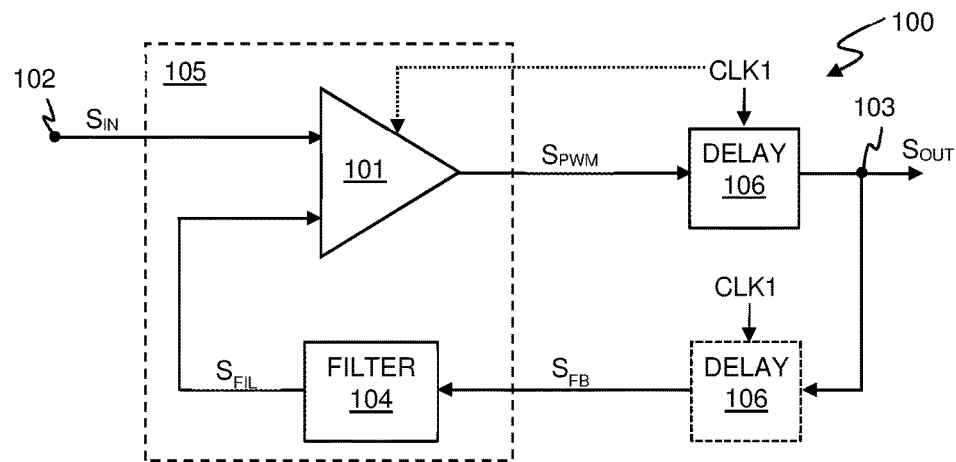
Figure 1
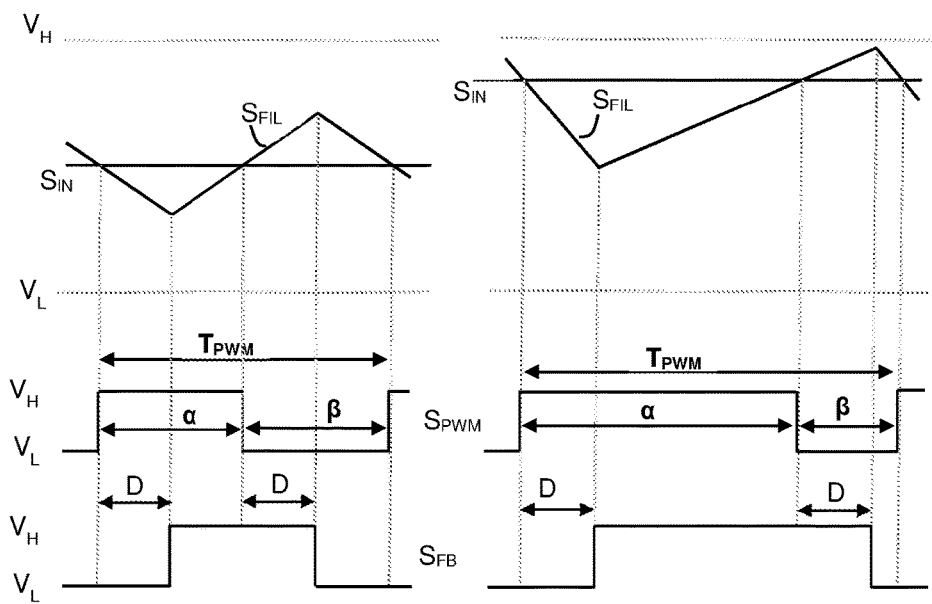
Figure 2aFigure 2b

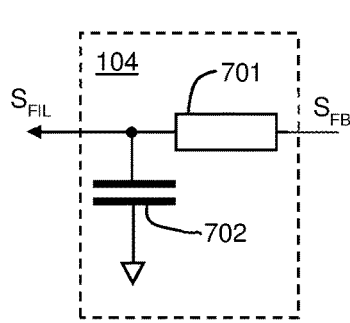
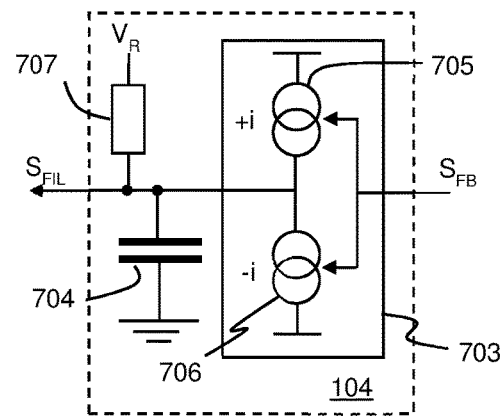
Figure 7a
Figure 7b
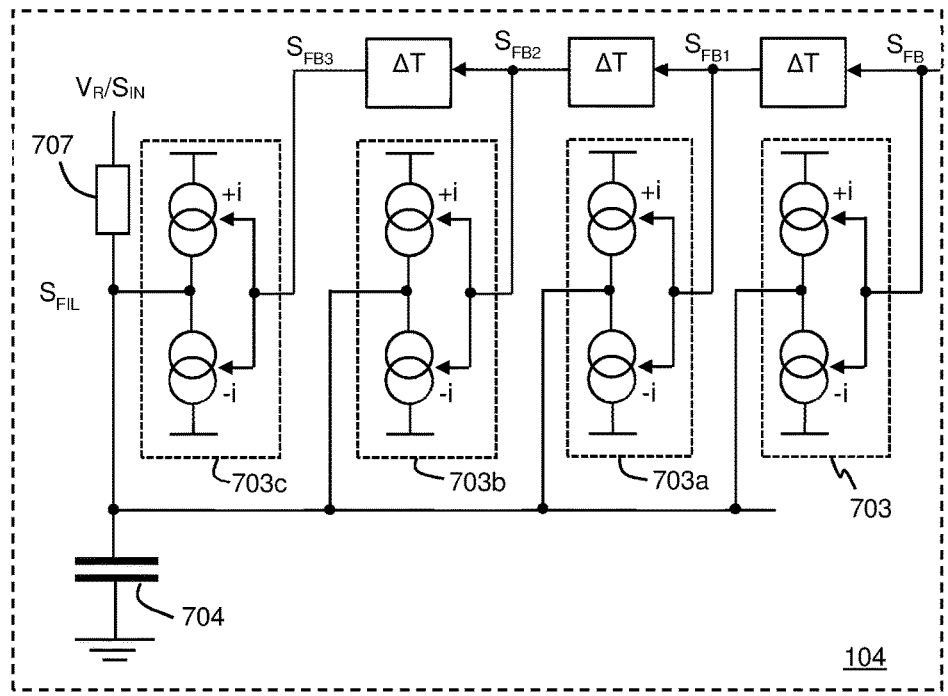
Figure 7c

US 10,348,282 B1

MODULATORS

TECHNICAL FIELD

The field of representative embodiments of this disclosure relates to methods, apparatus and/or implementations concerning or relating to modulators for signal modulation, and especially to time-encoding modulators such as modulators for generating pulse-width modulation signals.

BACKGROUND

Signal modulators are utilized in a number of applications, for instance as part of the conversion from analogue signals to digital signals or vice versa. For example sigma-delta (ΣΔ) modulators (SDM's) are a type of signal modulator that may be used to convert an input analogue signal into a pulse-density-modulated (PDM) signal comprising a series of digital ones and zeros at a fixed sample rate and the relative density of ones and zeros corresponds to the analogue signal's amplitude. However the fixed frequency inevitably introduces quantisation noise into the signal, and SDMs usually comprise also at least one functional operational amplifier.

Time-encoding modulators (TEMs) are modulators that encode input signals into a time-encoded data stream. One particular form of time-encoding is pulse-width modulation (PWM). In a PWM signal, an input value is encoded by the duration of a given output signal level, e.g. the duration or width of pulse of a first signal level, compared to the duration of any period(s) of any other signal level(s) in a cycle period. For a conventional two-level PWM signal, the input signal value may be encoded by the duty cycle of a pulse of a first signal level within the cycle period, i.e. the proportion of the cycle period spent at the first output signal level. Time-encoding modulators may encode an input signal into a PWM signal by comparing the input signal with a periodic reference signal, such as a triangular waveform to encode the input signal by the duration of pulses in the output signal. However this requires circuitry to generate an appropriately accurate periodic reference signal and/or operational amplifier circuitry.

In general there is a desire for smaller and/or lower power modulators that can be used, for example, as part of a signal converter such as an ADC or DAC.

SUMMARY

Embodiments of the present disclosure relate to improved time encoding modulators.

According to a first aspect there is provided a time-encoding modulator (TEM) comprising:
  a forward signal path from a modulator input for receiving an input signal and a modulator output for outputting a time encoded signal;
  a feedback path forming a feedback loop with at least part of the forward signal path;
  a comparator located in the forward signal path within the feedback loop;
  a filter located within the feedback loop;
  a delay element for applying a controlled delay within the feedback loop; and
  a latching element within the forward signal path, the latching element being configured to receive a first clock signal and to synchronise any signal transitions output from the latching element to the first clock signal such that any signal transitions in the output from the modulator are synchronised to the first clock signal;
  wherein the delay element comprises a digital delay element which is synchronised to the first clock signal.

In some implementations the latching element may comprise a latch configured to receive an output from the comparator. In some implementations the comparator may be a latched comparator comprising the latching element. In some implementations the digital delay element is in the forward signal path and is a latched digital delay element comprising the latching element.

The digital delay element may be located in the forward signal path between the comparator and said modulator output. Additionally or alternatively a digital delay element may be located in the feedback path.

In some implementations the digital delay element may comprise a counter, which may be referred to as a delay element counter, which is clocked by the first clock signal. The digital delay element is configured such that, in response to a signal transition at an input to the digital delay element, the delay element counter is configured to count for a defined number of clock periods before a corresponding signal transition at an output of the digital delay element. The digital delay element may comprise a digital comparator for comparing a count value from the delay element counter with a defined reference value and triggering a signal transition at an output of the digital delay element. The delay element counter may be configured to count up or down, and may count from a defined initial value to a threshold.

In some examples the digital delay element may comprise a tapped delay line.

The TEM may further comprises a cycle period controller for controlling at least one parameter of the modulator so as to control a cycle period of the time-encoded signal. The cycle period controller may be configured to control the modulator based on the time-encoded signal. In some examples the TEM has a time-to-digital-converter (TDC) configured to receive the time-encoded signal and output a digital control signal based on the time-encoded signal, wherein the cycle period controller is configured to receive the digital control signal. The digital control signal may be indicative of any of: a duration of a cycle period of the time-encoded signal; a duty-cycle of the time-encoded signal; and a duration of a pulse of the time encoded signal. The TDC may be configured to receive the first clock signal and may comprise a counter, which may be referred to as a TDC counter, configured to produce at least one count value of the number of clock cycles of the reference clock signal in a period defined by the time-encoded signal. In some examples the cycle period controller may be configured to control the at least one parameter of the modulator so as to maintain a cycle period of the time encoded signal within a defined range on a cycle-by-cycle basis. The cycle period controller may additionally or alternatively be configured control the at least one parameter of the modulator so as to dither the cycle period, e.g. to reduce the likelihood of unwanted tones in the time-encoded signal.

In some example the TEM may be operable in a first mode with a limit cycle frequency, for a quiescent input signal, equal to a first frequency and also in a second mode with a limit cycle frequency equal to a second different frequency. The cycle period controller may be operable to control the modulator parameter so as to implement the first and second modes.

In some instances the digital delay element may comprise a variable delay element for applying a controllably variable delay. In which case a parameter of the modulator controlled by the timing controller may be the delay applied by the variable delay element.

The digital delay element may, in some examples, comprise a counter, which may be referred to as delay element counter, which is clocked by the first clock signal and responsive to a signal transition at an input to the digital delay element to start counting from an initial count value. A digital comparator may receive a count value from the delay element counter and trigger a signal transition at an output of the digital delay element when the count value differs from an initial count value by an amount defined by a reference value. The defined reference value may for instance set a threshold value for the digital comparator or an initial count value for the counter following a reset. The cycle period controller may be configured to control the defined reference value.

In some embodiments the comparator is operable as a hysteretic comparator to apply a defined amount of hysteresis. In which case at least one parameter of the modulator controlled by the cycle period controller may comprise the amount of hysteresis applied by the hysteretic comparator.

In some embodiments the TEM may further comprises a variable analogue delay element for applying a controllably variable delay. At least one parameter of the modulator controlled by the cycle period controller may comprise the delay applied by the variable analogue delay element. The variable analogue delay element may thus be in addition to the digital delay element (which itself may or may not be a variable delay element).

In some examples at least one parameter of the modulator controlled by the cycle period controller comprises a parameter of the filter.

In some embodiments the comparator is operable as a hysteretic comparator to apply a defined amount of hysteresis.

The filter may located in the feedback path. In some examples the input signal is supplied to a first input of the comparator and a filtered signal output from the filter is supplied to a second input of the comparator. The filter may comprise a resistive-capacitive filter and/or may comprise an inductor.

In some implementations the filter comprises a current generator configured to receive the feedback signal and to generate a controlled current signal having a first defined current during periods of a first output state and a second defined current during periods of a second output state and a capacitor configured to be charged and discharged by the controlled current signal. In some examples the filter may further include at least one additional current generator, each additional current generator configured to receive a successively delayed version of the feedback signal, with capacitor of the filter being configured to be charged and discharged by the controlled current signal from each current generator.

In some instances a feedback signal from the feedback path may be combined with the input signal and filtered by the filter. A filtered signal output from the filter may be supplied to a first input of the comparator to be compared to a defined reference. In some examples the feedback path may comprise at least one current generator configured to receive the feedback signal and to generate a controlled current signal having a first defined current during periods of a first output state and a second defined current during periods of a second output state. The controlled current signal may be combined with the input signal. The filter may comprise a resistive-capacitor filter and/or may comprise an integrator. The filter may be a second or higher order filter.

The TEM may be implemented as part of a modulator circuit. The modulator circuit may have a counter, which may be referred to as a first counter, configured to receive the time encoded signal and generate count values of the number of clock periods of a second clock signal during periods defined by the time encoded signal. The second clock signal is synchronised to the first clock signal and in some instances may be the same as the first clock signal. The time encoded signal comprises cycles of pulses of first and second states and the first counter may be configured to generate a first count value for the duration of the pulse of the first state of the time-encoded signal during each cycle. The first counter may be further configured to generate a second count value for the duration of the pulse of the second state of the time-encoded signal during each cycle. In some instances the first counter may be configured to increment during the pulse of one state and to decrement during the pulse of the other state of a cycle so as to generate a difference count value for each cycle. The first counter may be further configured to generate a cycle count value for the duration of each cycle.

The modulator circuit may comprise a demodulator configured to receive the count values from the first counter and generate a digital output signal. The demodulator may comprise a sigma-delta demodulator. In some examples the sigma-delta demodulator may comprise an input for receiving a first received value, an adder for adding the first received value to an output from a modulus block, a memory for storing the output of the adder, a demodulator comparator for comparing a value stored in the memory to a second received value, wherein the modulus block is configured to apply a modulo operation to the output of the memory based on the second received value and wherein the first and second values are derived from the count values. In some instances the demodulator may comprise an asynchronous sample rate converter.

A modulator circuit may comprise the TEM and a demodulator comprising a numerically controlled oscillator (NCO). The NCO may be configured to receive the time encoded signal and generate an oscillator signal with a frequency that controllably varies based on the time encoded signal. A demodulator counter may be configured to receive the oscillator signal and count a number of oscillations of the oscillator signal in each of a succession of count periods.

A modulator circuit may comprise the TEM and a demodulator comprising a demodulator counter configured to receive an oscillation signal and count the number of oscillations of the oscillation during periods of a first signal level of the time encoded signal and configured not to count during periods of a second signal level of the time encoded signal. The oscillation signal may be the first clock signal. In one example the demodulator comprises an AND gate configured to receive the time encoded signal at a first gate input and the first clock signal at a second gate input. The demodulator counter may be configured to receive an output of the AND gate and count a number of oscillations in each of a succession of count periods.

In embodiments where the TEM has a cycle period controller, the cycle period controller may be configured to control at least parameter of the TEM based on the output of the demodulator.

The modulator circuit may be implemented as part of an analogue-to-digital converter (ADC). The ADC may be configured to receive an input audio analogue signal.

In one implementation a signal processing circuit may comprise such an ADC as a first ADC. The signal processing circuit may also have a main signal path for receiving a first analogue signal and outputting a first digital signal, with a main ADC in the main signal path and a variable analogue gain element for applying a controlled analogue gain to the main signal path upstream of the main ADC. The first ADC may be configured to receive a version of the first analogue signal from the main signal path and a gain controller may be configured to control the variable analogue gain element based on the output of the first ADC The TEM may be implemented as an integrated circuit, in some examples as part of a modulator circuit, ADC or signal processing circuit as described in any of the variants herein.

The TEM according to any of the variants discussed herein, or the modulator circuit, ADC or signal processing circuit, may be implemented as part of an electronic device. The device may be at least one of: a portable device; a battery powered device; a communications device; a mobile or cellular telephone; a smartphone; a computing device; a notebook, laptop or tablet computing device; a wearable device; a smartwatch; a voice-controlled device; a gaming device.

A variant of the first aspect provides a time-encoding modulator for receiving an input signal and outputting a time encoded signal comprising:
  a comparator and a filter arranged in a feedback loop of the modulator to generate the time encoded signal based on the input signal; and
  at least one delay element for applying a controlled delay within the feedback loop,
  wherein the delay element is a digital element clocked by a first clock signal.

In a second aspect there is provided a time-encoding modulator comprising:
  a forward signal path from a modulator input for receiving an input signal and a modulator output for outputting a time encoded signal;
  a feedback path forming a feedback loop with at least part of the forward signal path;
  a comparator located in the forward signal path within the feedback loop;
  a filter located within the feedback loop;
  a variable delay element for applying a controlled variable delay within the feedback loop; and
  a delay controller for controlling the delay applied by the variable delay element so as to control a cycle period of the time encoded signal.

The variable delay element may be a variable digital delay element or a variable analogue delay element.

The delay controller may be configured to control the delay applied by the variable delay element based on the time encoded signal.

A TEM according to the second aspect may be implemented in any of the variants described herein, in particular any of the features described with reference to the first aspect may be applied to a TEM according to the second aspect.

In a third aspects there is provide a time-encoding modulator comprising:
  a forward signal path from a modulator input for receiving an input signal and a modulator output for outputting a time encoded signal;
  a feedback path forming a feedback loop with at least part of the forward signal path;
  a hysteretic comparator located in the forward signal path within the feedback loop;
  a filter located within the feedback loop; and
  a delay element for applying a controlled delay within the feedback loop;
  wherein a cycle period of the time encoded signal depends on the hysteresis applied by the hysteretic comparator and the controlled delay within the feedback loop.

The delay element may be a digital delay element or an analogue delay element. The variable delay element may provide a fixed delay or may be a variable delay element.

A TEM according to the third aspect may be implemented in any of the variants described herein, in particular any of the features described with reference to the first or second aspects may be applied to a TEM according to the third aspect.

Unless expressly indicated to the contrary, any of the various features of the various implementations discussed herein may be implemented together with any one or more of the other described features in any suitable combination.

BRIEF DESCRIPTION OF DRAWINGS

For a better understanding of examples of the present disclosure, and to show more clearly how the examples may be carried into effect, reference will now be made, by way of example only, to the following drawings in which:

FIG. 1 illustrates one example of a time encoding modulator for outputting a time-encoded signal synchronised to a clock signal with a delay in the feedback loop;

FIGS. 2a and 2b illustrate the principle of operation of a delay based time encoding modulator;

FIGS. 7a, 7b and 7c illustrate examples of suitable filters for the time encoding modulator of FIG. 1;

DETAILED DESCRIPTION OF EMBODIMENTS

Figure 3:
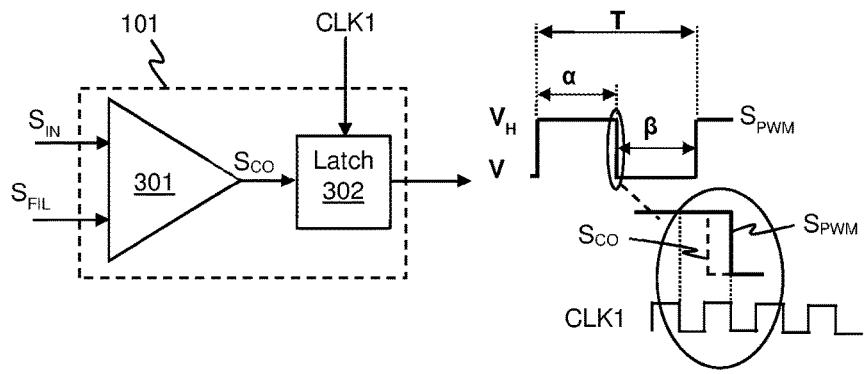
FIG. 3 illustrates one example of a latched comparator arrangement.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to time-encoding modulators (TEMs) and in particular to PWM (pulse-width modulation) modulators. In time-encoding modulators according to some embodiments a forward signal path extends from an input for receiving an input signal and an output for outputting a time encoded signal. A feedback path forms a feedback loop with at least part of the forward signal path. A comparator located in the forward signal path within the feedback loop of the time-encoding modulator, such that an input to the comparator depends, at least partly, on the output signal of the comparator. A filter is also located within the feedback loop, and thus can be seen as loop filter. The comparator and filter are configured to generate a time-encoded signal based on the input signal. The time-encoding modulator also includes at least one delay element for applying a controlled delay within the feedback loop.

In some embodiments the modulator, i.e. TEM, is configured such that any signal transitions in the output from the modulator are synchronised to a first clock signal and the delay element comprises a digital delay element which is synchronised to the first clock signal. The forward signal path may comprise a latching element for synchronising any signal transition to the first clock signal.

In some embodiments the delay element may comprise a variable delay element which can be controlled to selectively vary the amount of delay applied. A delay controller may be configured to control the delay applied by the variable delay element so as to control the cycle frequency of a time encoded signal output from the time-encoded modulator.

In some embodiments the comparator may be operable to apply hysteresis such that hysteresis and a controlled delay are applied in the feedback loop. The comparator may thus be a hysteretic comparator, such that a cycle frequency of the time encoded signal output from modulator depends on both the delay applied by the at least one delay element and the amount of hysteresis applied.

Various features of embodiments of the disclosure and the advantages thereof will be described further below.

FIG. 1 illustrates one example of time-encoding modulator (TEM) 100 according to an embodiment. FIG. 1 illustrates a comparator 101 arranged in a forward signal path between an input 102 for receiving an input signal $S_{IN}$ and an output 103 for outputting an output signal $S_{OUT}$. A feedback signal $S_{FB}$ is derived from the output 103 and fed back so that an input of the comparator 101 depends, at least partly, on the feedback signal $S_{FB}$. The comparator 101 is thus within a feedback loop. The modulator 100 also includes a filter 104 which is also within the feedback loop. As used herein the term feedback loop refers to the overall loop comprising the feedback path and the part of the forward signal path between the start and end of the feedback path. The part of the forward signal path within the feedback loop may be referred to as the feedforward path of the loop.

In this example the filter 104 is located in the feedback path between the modulator output 103 and an input to the comparator 101, and thus the filter 104 receives the feedback signal $S_{FB}$ derived from the output 103. In this example the feedback loop thus has a feedback path from the modulator output 103, to the input of the comparator 101, and a feedforward path including the comparator 101 and the downstream path from the comparator 101 to the modulator output 103, although other configurations are possible as will be discussed in more detail below.

Collectively the comparator 101 and filter 104 can be seen as a module 105 of the TEM, which receives the input signal $S_{IN}$ and the feedback signal $S_{FB}$, and which is configured to generate a time encoded signal, in this example a two-level pulse-width-modulated (PWM) signal $S_{PWM}$ with a duty cycle which varies with the input signal $S_{IN}$. The PWM signal $S_{PWM}$ output from the comparator 101 thus varies between two different signal levels, for example a high voltage level $V_H$ and a low voltage level $V_L$.

The filter 104 is configured to apply filtering, for instance so as to provide some averaging over time, such that the value of the output $S_{FIL}$ from the filter 104 increases or decreases over time, e.g. ramps-up or ramps-down, depending on the state, i.e. signal level, of the feedback signal $S_{FB}$, and also such that the rate of change of the output of the filter, e.g. the ramp rate, depends on both the signal level of the feedback signal $S_{FB}$ and also the signal level or value of the input signal $S_{IN}$, as will be described in more detail below. The filter 104 may, in some implementations, be a passive filter such as an RC type filter for example.

In the example of FIG. 1, the input signal $S_{IN}$ is provided to a first input of comparator 101 and the feedback signal $S_{FB}$ is filtered by the filter 104 to provide a filtered signal $S_{FIL}$ which is provided to a second input of the comparator 101. Such an arrangement can advantageously be implemented in a relatively small circuit area with a few components and with a relatively low power consumption in use. The input signal $S_{IN}$ may be supplied directly to an input of the comparator 101 which has a high input impedance. This arrangement thus provides a modulator with a high input impedance, which may be advantageous in some applications. In this example the comparator 101 thus compares the value of the filtered signal $S_{FIL}$ to the value of the input signal $S_{IN}$ and outputs one of the two output states, $V_H$ or $V_L$, based on the comparison. The comparator may, for example, output a high level output state, $V_H$, if the value of the input signal $S_{IN}$ at the first comparator input is greater than the value of the filtered signal $S_{FIL}$ at the second comparator input and a low level output state, $V_L$, if the value of the input signal $S_{IN}$ at the first comparator input is less than the value of the filtered signal $S_{FIL}$.

The modulator 100 also includes at least one delay element 106 within the feedback loop, such that there is a delay D between a change in output state of the comparator 101, i.e. a change in state of the PWM signal $S_{PWM}$ from the high output state $V_H$ to the low output state $V_L$ or vice-versa, and a corresponding change in state of the filtered signal $S_{FIL}$ at the second input of the comparator 101, i.e. a change from ramping-up to ramping-down or vice-versa. FIG. 1 illustrates that there may be a delay element 106 in the forward signal path between the output of the comparator 101 and the output node 103 from which the feedback signal is tapped). In this case the output signal $S_{OUT}$ is a delayed version of the PWM signal $S_{PWM}$. Additionally or alternatively there may be a delay element in the feedback path. In some embodiments the PWM signal $S_{PWM}$ could be used directly as the output of the TEM 100, i.e. the output signal could be taken from before delay 106, which is equivalent to delay 106 being in the feedback path.

The modulator 100 thus operates as a type of self-oscillating time-encoding modulator and encodes the value of the input signal $S_{IN}$ in the form of the duty-cycle of the PWM signal $S_{PWM}$ and hence the output signal $S_{OUT}$.

FIGS. 2a and 2b illustrate the principle of operation of a self-oscillating modulator with a delay in the feedback loop such as illustrated in FIG. 1 (ignoring for now any synchronisation to a clock signal as will be discussed in more detail later).

FIG. 2a shows how the value of the filtered signal $S_{FIL}$ received at one comparator input may vary with respect to the value of the signal received at the other comparator input, in this case the input signal $S_{IN}$. FIG. 2a also illustrates the resultant output PWM signal $S_{PWM}$ from the comparator 101 and the subsequent delayed feedback signal $S_{FB}$. In the example illustrated in FIG. 2a the value of the filtered signal $S_{FIL}$ is, initially, greater than the value of the input signal $S_{IN}$ and thus the output signal $S_{PWM}$ of the comparator 101 is in the low output state $V_L$. The feedback signal $S_{FB}$ is also in the low output state $V_L$ which, in this example, results in the value of the filtered signal $S_{FIL}$ ramping downwards towards $V_L$. Note that FIG. 2a illustrates the value of the filtered signal $S_{FIL}$ ramping in a linear fashion for ease of illustration and description, but in practice, in at least some implementations, the filtered signal $S_{FIL}$ may ramp in a non-linear fashion. It will also be understood by one skilled in the art that FIG. 2 is for illustrative purposes only and is not intended to be realistic in terms of the relative magnitude of the variation in the filtered signal $S_{FIL}$ with respect to the difference between $V_H$ and $V_L$.

The value of the filtered signal $S_{FIL}$ ramps downwards until it reaches the value of the input signal $S_{IN}$, at which point the output signal $S_{PWM}$ of comparator 101 transitions to the high output state $V_H$. However, because of the presence of delay element(s) 106, this change in output state of the comparator 101 will take some time to propagate through the delay element to change the state of the feedback signal $S_{FB}$. Thus, during the delay period D introduced by the delay element(s) 106, the feedback signal $S_{FB}$ will remain in the low state $V_L$ and the value of the filtered signal $S_{FIL}$ will continue ramping-down. After the delay period D, the feedback signal $S_{FB}$ will change state to the high output state, $V_H$. At this point the value of the filtered signal $S_{FIL}$ will start ramping-upwards, but from a value which is lower than the level of the input signal $S_{IN}$. The comparator 101 will thus continue to output the high level state $V_H$ until the level of the filtered signal $S_{FIL}$ reaches the level of the input signal $S_{IN}$, at which point the output state of the comparator 101 will change. In this example the time between the filtered signal $S_{FIL}$ equaling the input signal $S_{IN}$ when it is ramping-down and equaling the input signal $S_{IN}$ when it is ramping-up defines a duration α of a pulse of the high output state in the PWM signal $S_{PWM}$. Again however the change in state of the PWM signal $S_{PWM}$ output from the comparator 101 will not propagate to a change in state in the feedback signal $S_{FB}$ until after the delay period D introduced by the delay element(s) 106, at which point the value of the filtered signal $S_{FIL}$ will have increased to a value greater than the input signal $S_{IN}$. When the feedback signal $S_{FB}$ changes state, the value of the filtered signal $S_{FIL}$ will start ramping-downwards but the output of the comparator will remain in the low output state $V_L$ until the value of the filtered signal $S_{FIL}$ reaches the level of the input signal $S_{IN}$, thus providing a duration β of the low state in the output of the comparator. The duration β is therefore, in this example, the time between the filtered signal $S_{FIL}$ equaling the input signal $S_{IN}$ when it is ramping-up and equaling the input signal $S_{IN}$ when it is ramping-down.

The output of the comparator 101 will thus alternate between the two output states $V_H$ or $V_L$. The durations α and β spent in each output state will depend on the delay period D and also the rate of ramping of the filtered signal $S_{FIL}$. As can be seen from FIG. 2a, if the value of the filtered signal $S_{FIL}$ is ramping-down, the output of the comparator 101 will change at a first point in time but the change in state in the output of the comparator 101 will not propagate to a change in state in the feedback signal $S_{FB}$ until after the delay period D, and thus during the delay period the value of the filtered signal $S_{FIL}$ will continue ramping in the same direction. After the delay period, at a second point in time, the value of the filtered signal $S_{FIL}$ will be lower than the value of the input signal $S_{IN}$ by an amount equal to $D*R_N$ where D is the delay period and $R_N$ is the rate of downward ramping (i.e. the overall or average ramp rate over the whole delay period). At the second point in time, the state of the feedback signal $S_{FB}$ will change and the value of the filtered signal $S_{FIL}$ will start ramping-up. The comparator 101 will maintain the output in the high output state $V_H$ until the value of the filtered signal $S_{FIL}$ reaches the value of the input signal $S_{IN}$. If the rate of ramping-up of the filtered signal $S_{FIL}$ is $R_P$ (again considering an overall ramp rate) then it will take a period of $D*R_N/R_P$ for the filtered signal $S_{FIL}$ to ramp-up to reach the value of the input signal $S_{IN}$. At this point the output of the comparator will transition to the other output state $V_L$. Thus the duration α of a pulse of the high output state $V_H$ in the output of the comparator 101 will be given by:

$$\alpha = D*(1+R_N/R_P) \qquad \text{Eqn. (1)}$$

By a similar analysis the value of the filtered signal $S_{FIL}$ will continue to ramp-up for the delay period, and thus will reach a value of $D*R_P$ before it starts ramping-down at the rate of $R_N$ and thus the duration β of a pulse of the low output state $V_L$ will be given by:

$$\beta = D*(1+R_P/R_N) \qquad \text{Eqn. (2)}$$

It can be seen that if the ramp-up rate $R_P$ were generally equal to the ramp-down rate $R_N$, such as illustrated by FIG. 2a, the duration α of the pulse of the high output state $V_H$ would be generally equal to the duration β of the pulse of the high output state $V_L$ and each pulse would have a duration equal to 2*D giving a limit cycle period of 4D.

However, if the ramp-up rate $R_P$ were slower than the ramp-down rate $R_N$, the duration α of the pulse of the high state $V_H$ would be longer than the duration β of the pulse of the low output state $V_L$ and vice versa. FIG. 2b again illustrates the input signal $S_{IN}$, filtered signal $S_{FIL}$ and the resultant PWM signal $S_{PWM}$ and feedback signal $S_{FB}$, but FIG. 2b illustrates an example where $S_{IN}$ is a higher voltage and the filtered signal $S_{FIL}$ ramps-down more rapidly towards $V_L$ than was the case for FIG. 2a but ramps-up more slowly. During the delay period D the filtered signal $S_{FIL}$ experiences a greater excursion below the level of the input signal $S_{IN}$ than was the case for the situation of FIG. 2a and it takes a longer time to ramp back up to the level of the input signal $S_{IN}$. However, during the delay period D when the filtered signal value is still ramping-up, it experiences a smaller excursion, and then ramps-down more quickly once the state of the feedback signal $S_{FB}$ changes. For example if the ramp-down rate $R_N$ was twice the ramp-up rate $R_P$, the duration α of a pulse of the high output state $V_H$ would be equal to 3*D whereas the duration β of the pulse of the low output state $V_L$ would have a duration equal to 1.5*D giving a limit cycle frequency of 4.5D.

The filter 104 is configured as part of the TEM 100 such that the rate of change of the filter output signal $S_{FIL}$ depends on both the signal level of the feedback signal $S_{FB}$ and the signal level of the input signal $S_{IN}$, i.e. the rate of ramping of the filtered signal $S_{FIL}$ depends on a combination of the two signals.

For example, the filter 104 could be a first-order RC filter (as will be discussed later with respect to FIG. 7a) having a resistor (R) coupled in series in the feedback path between a filter input node, for receiving the feedback signal $S_{FB}$, and a filter output node, for providing the filtered signal $S_{FIL}$, with a capacitor (C) coupled between the filter output node and a reference voltage node, such as ground. In such a case the voltage of the capacitor effectively provides the value of the filtered signal $S_{FIL}$ and the capacitor is charged or discharged by a current flowing through the resistor due to the feedback signal $S_{FB}$. The magnitude of the charging or discharging current depends on the voltage difference across the resistor, which depends on the magnitude of the feedback signal $S_{FB}$ but also the present value of the voltage of the capacitor, i.e. the value of the filtered signal $S_{FIL}$. As will be clear from FIG. 2, the action of the feedback loop means that the value of the filtered signal $S_{FIL}$ varies around the level of the input signal $S_{IN}$, and thus the rate of ramping for such a filter 104 will generally depend on the difference between the value of the feedback signal $S_{FB}$ and the value of the input signal $S_{IN}$.

Thus, if the input signal $S_{IN}$ supplied to the comparator 101 has a value which corresponds to a mid-level value $V_{MID}$ half way between the high state $V_H$ and low state $V_L$ of the feedback signal $S_{FB}$, the value of the filtered signal $S_{FIL}$ will vary around such a mid-level value $V_{MID}$. In this case, when the state of feedback signal $S_{FB}$ transitions from high-to-low, so that the filtered signal $S_{FIL}$ starts to ramp-down, the magnitude of the voltage difference between the feedback signal $S_{FB}$ and the filtered signal $S_{FIL}$ will be substantially same as when the state of feedback signal $S_{FB}$ transitions from low-to-high. In which case the ramp-up rate will be substantially the same as the ramp-down rate which will lead to equal durations α and β of pulses of the high state and low state, such as illustrated in FIG. 2a.

If, however, the input signal $S_{IN}$ supplied to the comparator 101 has a value which is relatively high, say relatively close to the level of the high state $V_H$, as illustrated in FIG. 2b, the value of the filtered signal $S_{FIL}$ will also be relatively high. In such a case when the feedback signal $S_{FB}$ is in the high output state, the difference between the level of the feedback signal $S_{FB}$ and the filtered signal $S_{FIL}$ will be relatively low, leading to a relatively low rate of ramping. However when the feedback signal $S_{FB}$ is in the low output state, the difference between the level of the feedback signal $S_{FB}$ and the filtered signal $S_{FIL}$ will be relatively high, leading to a relatively high rate of ramping such as illustrated in FIG. 2b.

If the filter 104 is a relatively simple filter, such as a first order RC filter for example, the ratio of the rate of ramp-up $R_P$ to the rate of ramp-down $R_N$ will generally be given by:

$$R_P/R_N = (1-X)/(1+X)$$ Eqn. (3)

where X is a normalised value of the input signal within the range of +1 (corresponding to $V_H$) to −1 (corresponding to $V_L$). As such the durations α and β of pulses of the high state and low state in the PWM signal $S_{PWM}$ will vary according to:

$$\alpha = 2*D/(1-X) \quad \beta = 2*D/(1+X)$$ Eqn. (4).

The time encoding modulator 100 thus encodes the value of the input signal $S_{IN}$ by the durations α and β of pulses of the high state and low state in the PWM signal $S_{PWM}$. The PWM signal $S_{PWM}$ can be output directly as an output signal $S_{OUT}$ in the case where the delay element(s) 106 are located only in the feedback path, otherwise a version of the PWM signal $S_{PWM}$ which is delayed by a delayed element 106 can be output as the output signal $S_{OUT}$, which preserves the relative durations α and β.

The PWM cycle period $T_{PWM}$, is equal to α+β and is thus given by:

$$T_{PWM} = 4*D/(1-X^2)$$ Eqn. (5)

It will therefore be seen that the PWM cycle period, and hence the frequency $f_{PWM}$ of the PWM signal $S_{PWM}$, also varies with the level of the input signal $S_{IN}$. The PWM cycle period $T_{PWM}$ is at its lowest, and thus the PWM cycle frequency is highest, when the normalised input signal value X is zero. The PWM cycle period and frequency at this condition are referred to as the limit cycle period and limit cycle frequency respectively.

In at least some implementations the input signal $S_{IN}$ is offset and scaled with reference to the feedback signal levels $V_H$ and $V_L$ such that an input signal $S_{IN}$ of zero magnitude corresponds to a signal level equal to the midpoint voltage $V_{MID}$, and the input signal (received at the comparator 101 input) may vary positively or negatively within the range of $V_H$ to $V_L$. Thus the limit cycle condition applies for an input signal $S_{IN}$ of zero magnitude and any increase in magnitude of the input signal $S_{IN}$ results in a longer period and lower frequency whether the polarity of $S_{IN}$ is positive or negative.

Note, in each of the illustrated examples of FIGS. 2a and 2b the level of the input signal $S_{IN}$ is shown as being constant over time. In practice the input signal will be a time-varying signal that includes some information content of interest, for instance the input signal may be an analogue audio signal for example. In use, the modulator 100 may be designed and configured so that the PWM limit cycle frequency is significantly higher than the highest frequency components of interest in the input signal, such that input signal $S_{IN}$ will not vary significantly over the PWM cycle period.

The time encoding modulator 100 illustrated in FIG. 1 can thus convert an analogue input signal $S_{IN}$, such as an input audio signal for example, into a time-encoded signal, in this instance a PWM output signal $S_{OUT}$, where the level of the input signal $S_{IN}$ is encoded as the duty cycle of the PWM output signal $S_{OUT}$.

In the embodiment of FIG. 1 the modulator 100 is configured to receive a first clock signal CLK1 and the delay element(s) 106 are synchronised to the first clock signal CLK1, with the modulator 100 being configured to operate so that signal transitions in the output signal $S_{OUT}$ are synchronised to the first clock signal CLK1. In some embodiments the forward signal path may thus comprise at least one latching element, i.e. a synchronising element, for latching signal transitions in the forward signal path so as to be synchronised to the first clock signal CLK1. In some embodiments the latching element could be associated with the comparator 101 so that the PWM signal $S_{PWM}$ is synchronised to the first clock signal, or the latching element could be downstream of the comparator in the forward signal path, and possibly part of a delay element 106 in the forward signal path. The modulator 100 thus operates so that a rising edge in the output signal $S_{OUT}$, i.e. the beginning of a pulse of the high output state/end of a period of the low output state, is synchronised to the first clock signal CLK1, as is a falling edge, i.e. the end of a pulse of the high output state/beginning of a period of the low output state. This means that the durations α and β of pulses of the high state and low state in the output signal, and also the overall cycle period, will all correspond to integer numbers of periods of the first clock signal CLK1. This can be advantageous when the output PWM signal $S_{OUT}$ is output to a time-decoding converter (TDC) comprising a counter as will be discussed in more detail below.

In some embodiments the comparator 101 may comprise a latched comparator such that signal transitions in the PWM signal $S_{PWM}$ are synchronised to the first clock signal. FIG. 3 illustrates one example of a possible latched comparator 101. FIG. 3 shows that the latched comparator 101 includes a comparator element 301, which may operate in a similar manner as discussed previously to produce a comparator output $S_{CO}$ which will vary between the two output states, e.g. $V_H$ and $V_L$. The comparator output $S_{CO}$ is supplied to a latch 302 which is clocked by the first clock signal CLK1. In this example the comparator element 301 can transition from one output state to the other output state at any time, based on the comparison of the signals $S_{IN}$ and $S_{FIL}$ at its inputs. However, whenever the output state of the comparator element 301 transitions, i.e. whenever the comparator output $S_{CO}$ changes from $V_H$ and $V_L$ and vice-versa, the latch 302 will maintain its present output state until the next relevant clock edge of the first clock signal CLK1. Thus the corresponding change in state of the output of the latch 302 will be synchronised to the first clock signal CLK1. The latch 302 is thus effectively configured to sample the comparator output $S_{CO}$ at sampling times defined by the first clock signal CLK1 and to maintain that value as its output until the next sample time.

FIG. 3 also illustrates the general form of the waveform of the time-encoded signal $S_{PWM}$ which is generated at the output of the latched comparator 101. FIG. 3 illustrates, in an expanded form, an example of a possible relationship between the signal $S_{PWM}$ output from the latched comparator 101 and the intermediate signal $S_{CO}$ of the comparator element 301 when transitioning from the high output state to the low output state. In this example the latch 302 may sample the intermediate signal $S_{CO}$ output from the comparator element 301 at times defined by a rising edge of the first clock signal CLK1. It can be seen that at a first sample time defined by a rising edge of the first clock signal CLK1, the signal $S_{CO}$ from the comparator element 301 is still in the high state and so the latch 302 maintains its output in the high state. Subsequently, before the next sample time, the signal $S_{CO}$ from the comparator element 301 changes state, as indicated by the dashed line. However the latch 302 maintains its output in the high state until the next sample time. At this point the latch 302 samples the intermediate comparator signal $S_{CO}$ and switches to the low output state.

It will thus be appreciated that the output from the latch 302, and hence from the latched comparator 101, will still be a PWM signal with cycle-by-cycle durations of α and β of the first and second output states, but in this case the durations α and β and hence the overall cycle period $T_{PWM}$ will be integer multiples of the period of the first clock signal CLK1.

It should be noted that the comparator element 301 and latch 302 have been illustrated as separate components for ease of description, and in some embodiments the latch 302 may indeed be a separate component to a comparator element 301. In some implementations however the comparator and latch functions may be combined as a latched comparator such that there may not be a separate intermediate signal $S_{CO}$.

There are various ways in which a latched comparator 101 could be implemented. One skilled in the art will be well aware of how to implement a latched comparator 101 in which transitions in the output time-encoded signal $S_{PWM}$ are synchronised to a clock signal. For example some circuits are pre-set to a meta-stable state and then released on one edge of each period of a clock signal to make a comparison decision.

In embodiments where the PWM signal $S_{PWM}$ received by a delay element 106 is synchronised to the first clock signal CLK1, the delay element 106 may comprise a digital delay that is also clocked by the first clock signal CLK1. The delay element 106 may thus receive the PWM signal $S_{PWM}$ and delay propagation of any change in state of the PWM signal $S_{PWM}$ for a defined number of periods of the first clock signal CLK1 to provide a desired delay. Thus the delayed signal will also be synchronised to the first clock signal CLK1.

Such a digital delay, which is clocked by a clock signal so as to provide a delay for a controlled number of periods of the clock signal, can be readily implemented by relatively small and lower power circuitry to provide a controlled and accurate delay. The duration of the delay D may be defined by setting the number of clock periods for which the digital delay element 106 will delay any propagation of a change in state of its input to a change in state in its output. The use of a delay element 106, especially a digital delay element which is synchronised to a first clock signal, in the feedback loop of a self-oscillating modulator represents one particular novel aspect of this disclosure.

Figure 4A:
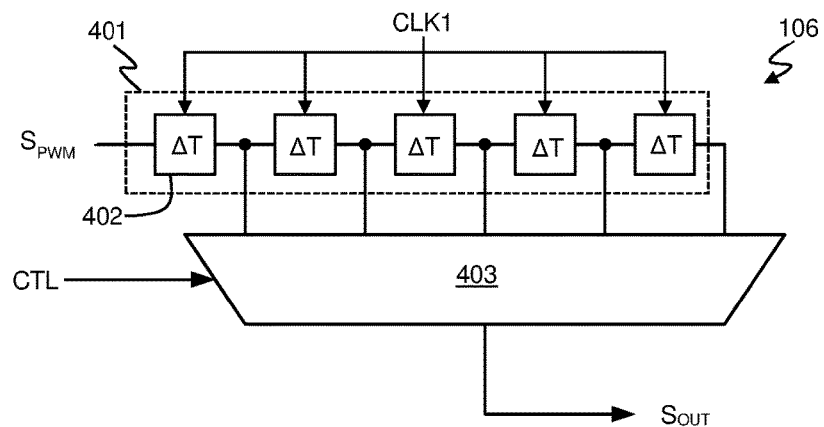
FIGS. 4a and 4b illustrate examples of a suitable digital delay elements.

FIG. 4a illustrates one example of a suitable delay element 106. FIG. 4a shows that the delay element 106 comprises a delay line 401. The delay line comprises a series of clocked delays 402. The delays 402, which may for instance comprise D-type latches or the like, are clocked by the first clock signal CLK1. The input to the delay line 401, which in this example is the PWM signal $S_{PWM}$ is thus delayed by one clock period by each successive delay in the line. In effect the delay line 401 can be seen as providing the same effect as a shift register or first-in-first-out (FIFO) buffer. The overall delay between a signal transition occurring in the input, e.g. $S_{PWM}$, and the corresponding signal transition at the output, e.g. $S_{OUT}$, is determined by the period of the first clock signal and the number of delays 402 in series in the signal path through the delay line 401. In some instance the delay line may be implemented with exactly the desired number of delays 402 in series to achieve a desired delay for a particular first clock signal. However in some embodiments it may be more convenient to use a tapped delay line such as illustrated in FIG. 4a. In a tapped delay line the output signal may be tapped from a plurality of different points along the delay line and the delay element is configurable so as to provide a selected number of delays 402 in in the signal path between the input and the output of the delay element 106. In the example illustrated in FIG. 4a, a multiplexor 403 is arranged to received signals tapped from different points along the delay line 401 and to selectively output one of these tapped signals as the output, e.g. in response to a control signal CTL. In this way the number of delays that are actually located in the in signal path through the delay element 106 may be selectively controlled, so as to implement a desired delay.

The use of a delay line 401, such as a tapped delay line, is a relatively simple and convenient way to provide a digital delay element. However, the delay line must comprise a sufficient number of clocked delays to provide the required delay. If a relatively long delay is required this may require the delay element to be relatively long in terms if the number of delays required.

In some embodiments the digital delay element 106 may comprise a counter which, in response to a signal transition, i.e. a change in state, at the input to the delay element 106, is arranged to count for a defined number of periods of the first clock signal before a corresponding signal transition at an output of the digital delay element, i.e. before the output state of the delay element changes.

Figure 4B:
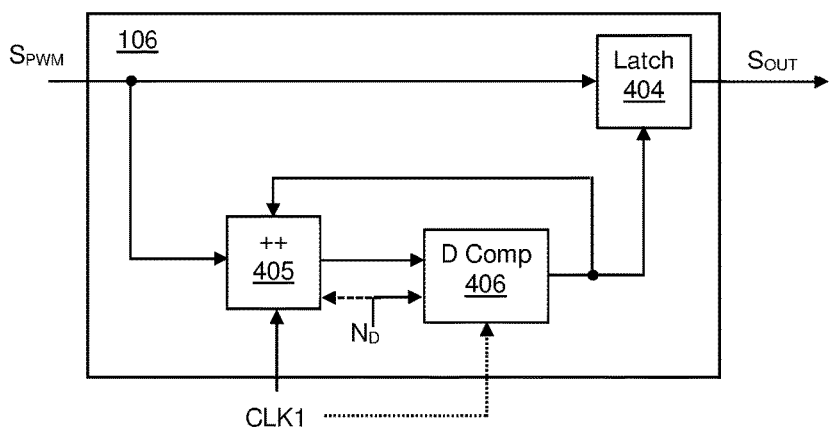

FIG. 4b illustrates an example of another type of digital delay element 106. In this example the delay element 106 receives a version of the time encoded signal, in this example the PWM signal $S_{PWM}$, which is provided to a latch 1504. A counter 405 is arranged to receive the first clock signal CLK1 and may be responsive to any signal transition in the PWM signal $S_{PWM}$, i.e. a rising edge or a falling edge, to start counting the number of periods of the first clock signal CLK1. A digital comparator 406 receives the current count value output from the counter 405. The counter 405 and comparator 406 are arranged so that when the present count value differs from an initial count value by an amount defined by a reference value $N_D$, the output of the digital comparator 406 changes state to trigger the latch 1504 to sample the PWM signal $S_{PWM}$ and also to stop and reset the counter 405. The counter will then be restarted by the next rising or falling edge of the PWM signal $S_{PWM}$. In some instances the defined reference value $N_D$ could be used to define a threshold for the comparator 406 and the counter 405 may be reset to an initial count value of zero. Other arrangements are possible however, for instance the reference value $N_D$ could set the initial value of the counter 405, and the counter may count to a pre-defined threshold. In some embodiments the counter may start from an initial non-zero value, say the defined reference value $N_D$ and decrement or count down each period of the first clock signal until the threshold, which could for example be zero, is reached.

In this way a signal transition in the PWM signal $S_{PWM}$ starts a count (up or down) of the number of periods of the first clock signal CLK1 and the latch 1504 is activated so as to sample the PWM signal $S_{PWM}$ only after the count value reaches a defined value. Thus any change in state of the PWM signal does not propagate to a change in state of the output signal $S_{OUT}$ until after a delay period corresponding to the defined number of periods of the first clock signal CLK. It will of course be understood that this is only one possible arrangement and the skilled person will be aware of other delay arrangements based on a counter.

A delay element 106 such as illustrated in FIG. 4a or FIG. 4b can be used in the forward signal path between the comparator 101 and modulator output 103 and/or could be arranged in the feedback path between the output 103 and modulator module 105. In either case the delay element may receive the PWM signal $S_{PWM}$ which is synchronised to the first clock signal CLK1 and provide a desired delay corresponding to an integer number of clock periods of the first clock signal CLK1. The desired delay can be defined by selecting an appropriate tap point from delay line 401 in the example of FIG. 4a or by setting the reference value $N_D$ for the example of FIG. 4b. Such a delay can be readily defined to a time resolution that is set by the period of first clock signal CLK1. As discussed above the limit cycle frequency of the TEM 100 depends on the overall delay within the feedback loop between a change in state of the output of the comparator 101 and the corresponding change in state in the filtered signal at the input of the comparator 101. A delay element such as illustrated in FIG. 4a or 4b allows a defined delay to be set to provide desired limit cycle characteristics, e.g. the limit cycle frequency for an input signal of zero magnitude.

It will be understood that any delay in the feedback loop will lead to the operation described with reference to FIG. 2 and thus in theory a delay element could be located between the filter 104 of FIG. 1 and the input of the comparator 101. However it will be appreciated that the output of the filter 104 is effectively an analogue signal that ramps-up or down. The digital delay element 106 illustrated in FIG. 4a or FIG. 4b is intended for operation with a two-level signal such as the PWM signal $S_{PWM}$ and thus such a digital delay should be used in forward path downstream of the comparator 101 and/or in the feedback path upstream of any filter. A digital delay 106 of the type illustrated in FIG. 4a or 4b would therefore not be suitable for use between an output of the filter 104 and an input of the comparator 101. In some implementations however an analogue delay element could be included between the filter 104 and comparator 101 to provide part of the desired delay in the feedback loop.

As noted above the delay element 106 illustrated in FIG. 4a includes a number of clocked delays 402, which may effectively be latches. In some embodiments a delay element 106 including a latch could be used to provide the latching function to synchronise the output signal $S_{OUT}$ to the first clock signal. Thus, in some embodiments, the PWM signal $S_{PWM}$ output from the comparator 101 may be supplied to a delay element 106 in the forward signal, prior to the modulator output 103, so as to provide delay and latching. In effect the first clocked delay 402 or latch of the delay line 401 would act in the same way as the latch 302 discussed with reference to FIG. 3, with the rest of the delay line 401 providing a defined delay equal to an integer number of clock periods of the clock signal. It will be appreciated that this is equivalent to latching the PWM signal $S_{PWM}$ to the first clock signal as discussed above and then applying a fixed delay of an integer number (but one fewer) clock periods.

In some embodiments therefore a latching element for synchronising the output PWM signal $S_{OUT}$ to the first clock signal CLK1 may be implemented as part of a delay element 106 which is located in the forward signal path, downstream of the comparator 101 but upstream of the modulator output 103. In which case the PWM signal $S_{PWM}$ which is output from the comparator may not necessarily be synchronised to the first clock signal. It will be understood however that if the delay element(s) 106 were located in the feedback path only, so that the PWM signal $S_{PWM}$ was output directly as the output signal $S_{OUT}$, the PWM signal $S_{PWM}$ would need to be synchronised to the first clock signal CLK1 if it was desired that the output signal be synchronised to the first clock signal CLK1.

The digital delay 106 illustrated in FIG. 4b also includes a latch 404 in a signal path in parallel to one including counter 405 and, in theory, such a delay could also be used to receive a signal, such as the PWM signal $S_{PWM}$, which is not synchronised to the first clock signal to provide latching and delay. In practice however to avoid any glitches if a signal transition is close to, but not synchronised to, a clock edge and applied to latch 404 and counter 405 in parallel, it may be advantageous in at least some implementations to ensure the input signal to a digital delay element 106 such as shown in the FIG. 4b is synchronised to the first clock signal.

It should be noted that, as used herein, the term delay element is used to refer to an element that applies, at least, a known defined or controlled delay. The term digital delay shall be used to refer to a delay that always provides at least a minimum delay of an integer number of clock periods of a clock signal which is defined or controlled in some way. A latch which is clocked by the first clock signal, such as the latch 302 described with reference to FIG. 3, is not a delay element as the term is used herein, as any delay provided is not well-defined. If a signal transition at the latch input (e.g. in signal $S_{CO}$ in FIG. 3) were to occur just before the instant that the clock signal controls the latch to sample its input, then there would be essentially no delay in that signal transition propagating to the output of the latch. If a signal transition at the latch input (e.g. in signal $S_{CO}$ in FIG. 3) were to occur just after the instant the clock signal controls the latch to sample its input, then there will be essentially a full clock cycle of delay before the latch output would actually change. Depending on the timing of the signal transition, any intermediate value might also occur in a cycle.

In some embodiments the first clock signal may have a frequency of the order of a few hundred MHz, say 300 MHz for example, so as to give a useful time resolution for the time-encoded signal. In such a case, where the first clock signal is also used to provide a delay of a defined integer number of clock cycles, the defined delay may be in the range of say 20 to 200 clock periods, e.g. at least ten or more clock periods. It will thus be appreciated that the controlled delay applied is significantly greater than the amount of any delay error due to latching.

In some embodiments the function of a digital delay and latching can be combined as discussed above in relation to FIG. 4a. It will be understood however that in such a digital delay element there is a defined delay of an integer number of clock periods which will be applied, irrespective of the timing of any signal transition in the input to the delay, although the latching may result in some variability within one clock period.

Thus by using a latched comparator 101, such as described with reference to FIG. 3 for example, and/or a delay element 106 such as illustrated in FIG. 4a or 4b, a defined delay can be easily implemented to provide a desired limit cycle characteristic for the time-encoding modulator 101 and the output signal $S_{OUT}$ can be synchronised to a first clock signal.

Synchronising the output PWM signal $S_{OUT}$ from the time-encoding modulator (TEM) 100 to the first clock signal can provide advantages for the downstream processing of the output signal $S_{OUT}$. In various embodiments the PWM output signal $S_{OUT}$ may be received by a time-decoding converter (TDC) to convert the PWM signal to a digital signal. For example the TEM 100 may be used with a suitable TDC as part of an analogue-to-digital converter (ADC).

Figure 5:
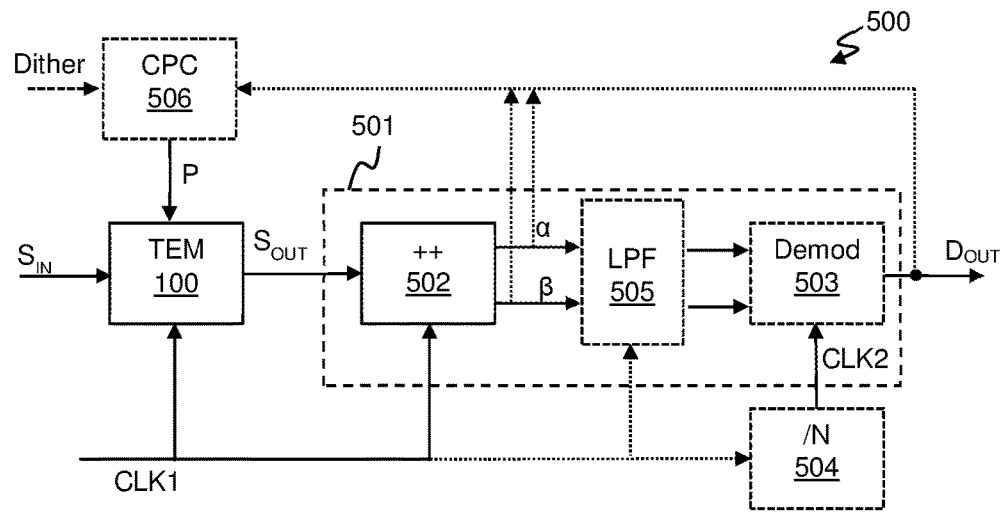
FIG. 5 illustrates an example of analogue-to-digital conversion circuitry including a time encoding modulator.

FIG. 5 illustrates one example of an ADC 500 including a time-encoding modulator (TEM) 100 according to embodiments. FIG. 5 illustrates that the TEM 100 receives the input signal $S_{IN}$. In at least some implementations the TEM 100 also receives the first clock signal CLK1 and generates the time-encoded output signal $S_{OUT}$ such that signal transitions of the output signal $S_{OUT}$ are synchronised to the first clock signal. The output signal $S_{OUT}$ from the TEM 100 is received by a time-decoding converter (TDC) 501. The TDC 501 includes a counter 502 which is clocked by the first clock signal.

The counter 502 may be configured to produce a count value of the number of clock periods of the first clock signal CLK1 in a periods defined by the durations α and β of the pulses of the output PWM signal $S_{OUT}$ so that an indication of the duty cycle can be determined, e.g. by a demodulator 503 as a value α/(α+β) or (α−β)/(α+β).

If the durations α and β of the pulses of the output PWM signal $S_{OUT}$ are not synchronised to the first clock signal, there could be a quantisation error associated with these count values. The extent of such a quantisation error would be determined by the time resolution of the counter 502, which would depend on the frequency of the first clock signal CLK1. Thus, for example, if the first clock signal CLK1 had a frequency of, say, 100 MHz, the difference between a count value of M and a count value of M+1 corresponds to a difference in time of 10 ns and thus the minimum time resolution of the TDC 501 would be 10 ns. The resulting quantisation noise spectrum of a purely counter based TDC is effectively flat. To provide a sufficient time resolution to provide an acceptable quantisation error for many applications would require the first clock signal to be very fast, for instance of the order of several GHz. Such a fast clock speed is undesirable for power and practicality reasons.

Conventionally therefore a TDC arranged to receive and convert a PWM signal may comprise a voltage controlled oscillator (VCO) which generates an oscillation signal whose frequency is controlled based on the state of the PWM signal. A counter could then be arranged to receive the oscillation signal from the VCO and count the number of oscillations in a frame period defined by a frame clock signal. Over the course of several frames the average count value will depend on the amount of time that the time-encoded signal spends in one state, controlling the VCO to output a first frequency, compared to the amount of time that the time-encoded signal spends in the other state, controlling the VCO to output a second frequency. Thus the average count value is related to the duty cycle of the time-encoded signal and hence the level of the input signal. Such a count value can be normalised to some desired range and output as a digital output signal representative of the input signal. The use of a VCO provides some noise shaping, as would be understood by one skilled in the art. The quantisation error at low frequencies associated with the counter is reduced as any error in one frame, e.g. any difference between the clock edge defining the end of the frame and the end of the oscillation at the end of the frame, is carried forward to the next frame. The quantisation noise at higher frequencies is increased, but this may be removed by downstream digital filtering without affecting a signal band of interest, such as the audio signal frequency band. The use of a VCO in a TDC thus allows accurate conversion with clock rates that are significantly lower than the clock rates of several GHz mentioned above that may conventionally be considered as being needed for use of a counter alone.

However whilst a VCO based TDC provides good performance for a number of applications, the power requirements for the VCO may be disadvantageous in some instances.

In embodiments of the present disclosure however, the TEM 100 receives the first clock signal CLK1 and, as described previously, synchronises any signal transitions in the output time-encoded signal $S_{OUT}$ to the first clock signal. Thus, as mentioned, the durations α and β of the pulses of the PWM signal $S_{OUT}$ will correspond to integer number of periods of the first clock signal CLK1. As such the counter 502 of the TDC 501 can determine count values for these periods without introducing any quantisation error at all.

It will be appreciated that constraining the time-encoded signal $S_{PWM}$ which is output from the TEM 100 to change state at a time synchronised to the first clock signal CLK1 will result in the durations α and β possibly being different from what they might otherwise have been, introducing a quantisation error. However it will be noted that the feedback signal $S_{FB}$ is derived from the synchronised time-encoded signal $S_{OUT}$. Any such quantisation error thus occurs within the feedback loop of the TEM 100, which provides some noise shaping.

Referring back to FIG. 3, the operation of the latch 302 can be seen as adding some variable delay between when the output of the comparator element 301 would transition (based on the inputs to the comparator element 301) and when the PWM signal $S_{PWM}$ actually transitions. This variable delay due to latching is in addition to the controlled delay for a defined delay period D applied by the delay element 106. This additional variable delay can be seen as introducing an error in the duration of the relevant pulse, e.g. in the duration α by extending the duration. However, as will be clear from FIGS. 2a and 2b, an extended duration for the pulse a will result in the filtered signal $S_{FIL}$ ramping a bit higher than it otherwise would have done before the state of the feedback signal $S_{FB}$ changes, which will mean that the filtered signal $S_{FIL}$ will then have to ramp-down further for the comparator output to transition again, thus also extending the duration β. It can therefore be seen that the error introduced by extending the duration α to synchronise with a clock edge of the first clock signal CLK1 is, in effect, carried forward into determination of the duration β in a way that acts to maintain the duty cycle. A similar effect would occur if the PWM signal $S_{PWM}$ were not synchronised to the first clock signal CLK1 but instead the synchronising were applied by a delay element 106 such as illustrated in FIG. 4a. Again any quantisation error would be within the feedback loop.

By introducing the quantisation error within the loop of the time-encoding modulator 100 in this way, the TEM 100 thus provides noise shaping in a similar way as discussed above in relation to a VCO based TDC, but provides a time-encoded signal $S_{OUT}$ which is synchronised to a first clock signal. This means that the durations of pulses of the time encoded signal $S_{OUT}$ can be supplied directly to a counter 502 that is synchronised to the first clock signal to provide count values without introducing any quantisation error.

In the ADC illustrated in FIG. 5, the time-encoded signal $S_{OUT}$ is supplied to TDC 501, which comprises a counter 502 configured to the count the number of pulses of a TDC clock signal in the periods defined by the time-encoded signal $S_{PWM}$. The TDC clock signal which is used to clock the counter 502 is synchronised to the first clock signal CLK1 and may conveniently, as illustrated in FIG. 5, be the first clock signal CLK1, or a version thereof, however it would be possible to use a TDC clock which is a frequency multiple of the first clock signal CLK1.

Given that the transitions in the time-encoded signal $S_{OUT}$ are synchronised to the first clock signal CLK1, the durations of the periods α and β of the time-encoded signal $S_{OUT}$ will correspond exactly to integer multiples of the period of the first clock signal CLK1. The counter can thus produce count values indicative of the periods α and β without introducing any quantisation error.

FIG. 5 illustrates a single counter 502. The counter may be arranged to count during each pulse of the time-encoded signal $S_{OUT}$, high or low, and reset at the end of each pulse. In some implementations the counter 502 may be provided by first and second counter elements (not illustrated). The first counter element may be configured to count during a period of the first output state of the time-encoded signal $S_{OUT}$, e.g. to determine a count value for a, with the second counter element being configured to count during a period of the second output state, e.g. to determine a count value for β. Other arrangements are possible however.

As mentioned the level of the input signal $S_{IN}$ is encoded by the duty cycle of the pulses in the time-encoded signal $S_{OUT}$ and may be decoded as $(\alpha-\beta)/(\alpha-\beta)$ or as $\alpha/(\alpha-\beta)$ for example. Providing separate counts for α and β allows the desired demodulation to a digital value to be performed and values such as α+β or α−β can be readily determined. However, in some arrangement the counter could also be arranged to provide a count of the cycle period $T_{PWM}$, i.e. a count directly of α+β. Additionally or alternatively an up-down counter could be arranged to increment during the pulse of one output state and decrement during the pulse of the other output state to provide a count value indicative of α−β.

The count values, which in this example may be the count values α and β, may be provided to a demodulator 503 for conversion to a digital output, e.g. as $(\alpha-\beta)/(\alpha+\beta)$ or as $\alpha/(\alpha+\beta)$, which digital value may be output as a digital output signal $D_{OUT}$. In some implementations the demodulator may comprise an asynchronous sample rate converter (ASRC) to provide a regular sample rate, although in some implementations an ASRC may be provided downstream or may not be required.

There are various ways in which the count values could be demodulated to provide the digital output. As noted above however the input signal is encoded as the duty cycle of the time-encoded signal $S_{PWM}$. As the cycle period itself $T_{PWM}$ is variable, i.e. the value of interest is $(\alpha-\beta)/(\alpha+\beta)$ or as $\alpha/(\alpha+\beta)$ where the value of α+β is variable, this involves a divide operation. Normally divide operations may be computationally expensive.

In embodiments of the disclosure however the demodulation may be achieved in a computationally efficient way through use of a sigma-delta modulator (SDM).

Figure 6A:
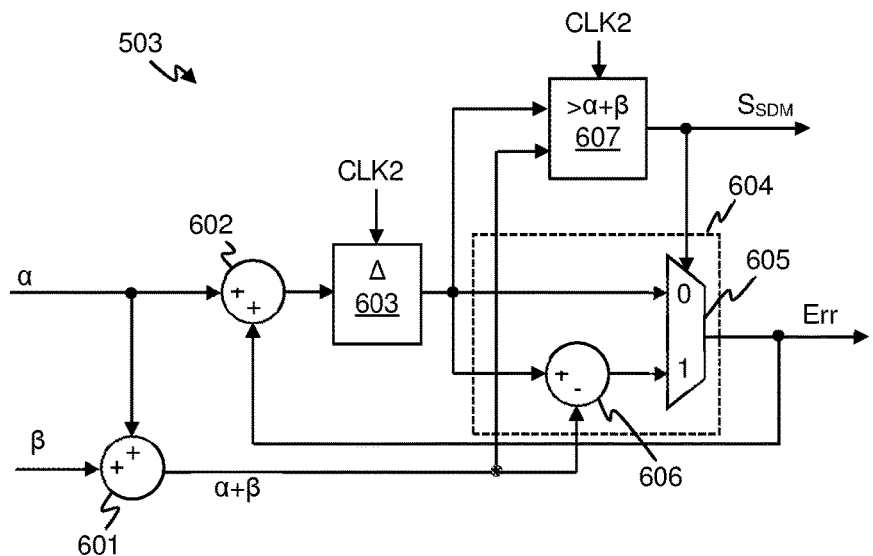
FIGS. 6a to 6d illustrate examples of suitable demodulator arrangements.

FIG. 6a illustrates one example of a suitable SDM based demodulator 503. In this example the SDM demodulator 503 receives counts values α and β and thus the two count values are added, by adder 601, to provide a value equal to α+β.

The SDM demodulator 503 comprises adder 602, memory 603, modulus block 604 and comparator 605. The modulus block 604 is configured to apply a modulus operation to the output of the memory 603 where the modulus operator is defined by the value α+β. Thus the output of the modulus block 603 is equal to the value presently stored in memory 603 whilst below the value α+β, but when the value stored in memory exceeds α+β the output is equal to the present value minus α+β.

The modulus block 604 in this example is implemented by multiplexor 605 which receives the output of memory 603 directly as one input and receives the output of memory 603 from which the value α+β has been subtracted by subtractor 606 as a second input. The multiplexor 605 is controlled by the output of comparator 607 which compares the stored memory value to the value α+β.

During each clock cycle of a SDM clock signal CLK2 the SDM modulator adds the count value α to the output of the modulus block 604 and stores the new value in memory 603. The value in memory 603 is also compared, by comparator 607, to the value α+β. So long as the stored memory value is lower than α+β, the output of the comparator 607 remains low, and thus multiplexor 605 outputs the stored value of memory 603. Thus the value stored in memory 603 will increment by an amount equal to a until the value in memory 603 exceeds α+β. At this point the output of the comparator 607 will go high, to output a pulse. The multiplexor 605 will thus switch to outputting its second input, which is equal to the stored memory value minus α+β. This is the value that will thus be added to the count value α and stored in memory 603 in the next clock cycle.

The operation of the SDM demodulator 503 thus produces a signal $S_{SDM}$ in the form of a series of pulses at the output of comparator 607, where the frequency of the pulses depends on the ratio of the value α to the defined threshold α+β, in other words the output signal $S_{SDM}$ of the SDM demodulator 503 is a pulse-density modulated (PDM) data stream $S_{SDM}$ where the pulse density depends on α/(α+β). Such a PDM data stream is thus a digital representation of the input signal $S_{IN}$ to the ADC circuit 500 illustrated in FIG. 5. The PDM data stream $S_{SDM}$ may thus be output as the digital output signal $D_{OUT}$ or may be converted to any other digital format as desired for the digital output signal $D_{OUT}$.

Figure 6B:
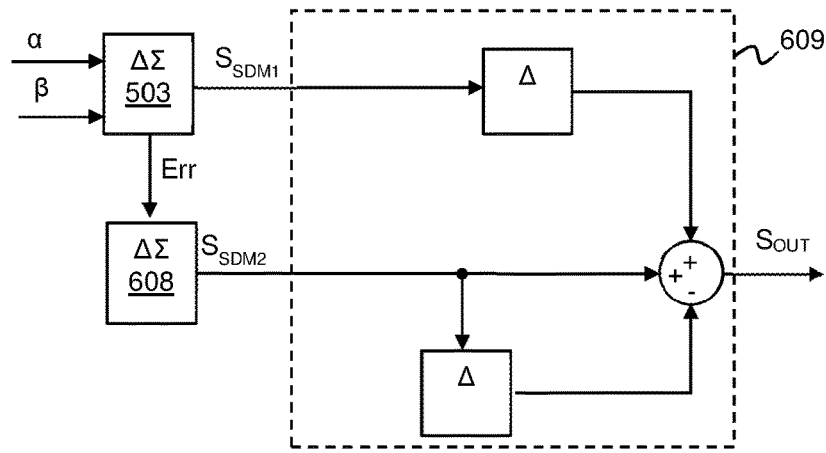

Note that FIG. 6a illustrates a first order sigma-delta arrangement. As will be understood by one skilled in the art the same principles could be extended to higher order modulators, for instance according to the known MASH (Multi-stage-noise-shaping) arrangement, in which case the output of the modulus block 604 during the period when the output of comparator 607 is high could be provided as an error signal for use by a subsequent stage. FIG. 6b illustrates one example of a second order SDM demodulator. A first SDM demodulator 503 such as illustrated in FIG. 6a receives the input count values α and β and produces a first PDM signal $S_{SDM1}$ as discussed above. The error signal Err of the first SDM demodulator 503 is supplied to a further SDM modulator 608 which produces a second PDM signal $S_{SDM2}$ based on the error, which is combined with the first signal via recombination stage 609.

Conveniently the SDM clock signal CLK2 used to control the SDM demodulator(s) will be synchronised to the first clock signal CLK1, to which the time-encoded signal is synchronised. Referring back to FIG. 5, the SDM clock signal CLK2 may conveniently be derived from the first clock signal CLK1, e.g. by frequency divider 504. The SDM demodulator may thus be clocked at a lower clock rate than the counter 502 of TDC 501. Operating a lower clock rate may result in some of the power of higher frequency components folding down into the signal band of interest and increasing the noise with the signal band. In some implementations therefore a filter arrangement 505 may be arranged to provide filtering of the count values α and β for anti-aliasing. The filter arrangement 505 may apply low-pass filtering to the count values α and β in any convenient way.

SDM based demodulators such as illustrated in FIG. 6a or 6b are thus one efficient way in which the time-encoded signal may be demodulated. It should be understood however that other demodulation techniques could be applied in some implementations.

Figure 6C:
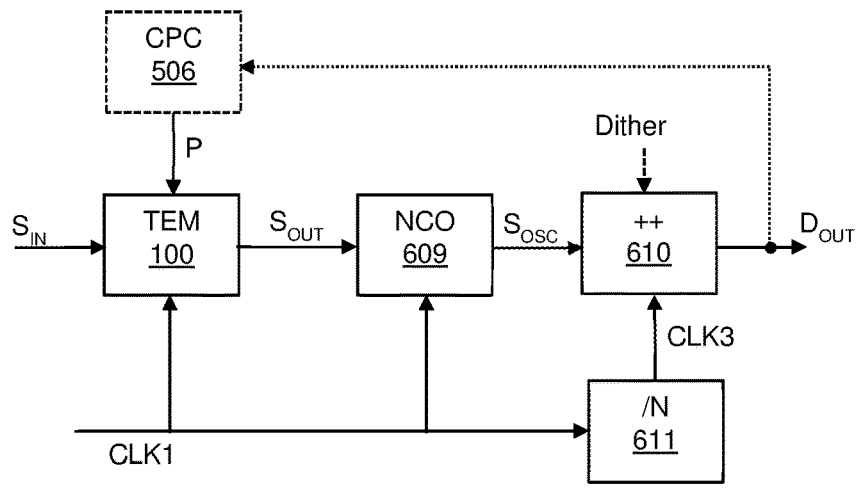

FIG. 6c illustrates one example of an alternative demodulation arrangement. FIG. 6c shows that the TEM 100 may generate the time-encoded output signal $S_{OUT}$, which is input to a numerically controlled oscillator (NCO) 609. The NCO 609 generates an oscillator signal $S_{OSC}$ with a frequency that varies based on the level of the time-encoded signal $S_{OUT}$. As the time-encoded signal $S_{OUT}$ is a two-level signal, the oscillator signal $S_{OSC}$ may vary between two different frequencies, f1 and f2, depending on the state of the time-encoded signal $S_{OUT}$. The oscillator signal $S_{OSC}$ is input to a counter 610 which produces a count of the number of oscillations of the oscillator signal $S_{OSC}$ in a period defined by a clock signal; CLK3. The clock signal CLK3 may be a frequency divided version of the first clock signal CLK1 produced by frequency divider 611 and/or may be a system clock. The counter produces a count of the number of oscillations in the oscillator signal in a period defined by the clock signal CLK3. This count value will depend on the proportion of time that the time-encoded signal $S_{OUT}$ is in one state, and thus the NCO 609 outputs the oscillator signal at the first frequency f1, compared to the time that the time-encoded signal $S_{OUT}$ is in one state, and thus the NCO 609 outputs the oscillator signal at the first frequency f2. The count value for each count period thus relates to the time that the time-encoded signal spends in each state and hence is indicative of the duty cycle of the time-encodes signal and hence the level of the input signal $S_{IN}$. Compared to the demodulator arrangement described with reference to FIGS. 6a and 6b the arrangement of FIG. 6c produces count values at a consistent sample rate which is matched to the frequency of the clock signal CLK3, which as mentioned above may be a system clock. The count value may be decimated and/or normalised and output as a digital value $D_{OUT}$ or in some implementations the count values may be output as the output $D_{OUT}$ for downstream decimation.

Figure 6D:
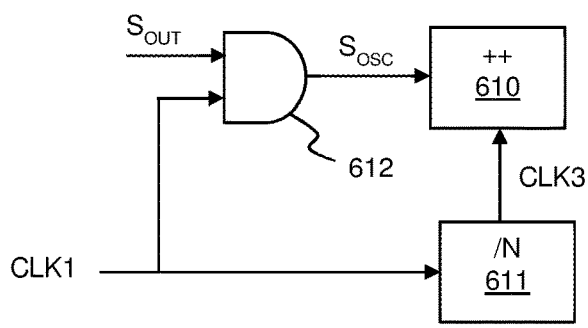

In some instances the NCO may be configured such that the frequency of the oscillator signal may be zero for one signal level of the time-encoded signal $S_{OUT}$ and a non-zero frequency for the other signal level of the time-encoded signal $S_{OUT}$. The use of an NCO 606 means that the oscillator signal can readily alternate between a non-zero frequency for a first signal level, say the high state $V_H$ and a zero-frequency, i.e. non varying, for a second signal level, say the high state $V_L$. In this way the NCO 609 can effectively be implemented by gating the first clock signal CLK1. FIG. 6d illustrates that the first clock signal CLK1 and the time-encoded signal $S_{OUT}$ may be both supplied to an AND gate 612. When the time-encoded signal is in the high state $V_H$, the first clock signal CLK1 is effectively supplied as the oscillator signal $S_{OSC}$. When the time-encoded signal is in the low state $V_L$, the output of the AND gate 612 is low and non-varying, i.e. corresponds to a zero frequency oscillator signal $S_{OSC}$. Alternatively, counter 610 may (already) be provided with an enable/disable input which may be driven by $S_{OUT}$ while the counter 610 receives an uninterrupted clock CLK1. There are various ways in which a clock signal could be gated and/or a counter strobed so as to count in periods defined by pulses of the output signal $S_{OUT}$.

Such an arrangement can be advantageous in attenuating at least some high-frequency noise components. The output signal $S_{OUT}$ is a two-level waveform at frequency equal to the PWM cycle frequency, so may contain energy near at least some harmonics of the PWM cycle frequency. The accumulation of counts at each PWM cycle period provides a frequency response with nulls at these harmonics, so can reduce the energy near these harmonics. This can allow for reduced filtering requirements for downstream filtering or decimation circuitry. This arrangement may thus enable a low-complexity low-power implementation compared to a conventional direct implementation of a CIC decimation filter where wide data words may be necessary to maintain internal accuracy.

The use of an NCO and counter to demodulate the output of a time-encoded signal which is synchronised to a first clock signal represents another novel aspect of the present disclosure, in particular the use of a gated supply of the first clock signal to the counter based on the state of the first clock signal and/or strobing of the counter to enable counting and reset a count value based on the state of the first clock signal.

A TEM 100, which produces an output time-encoded signal $S_{OUT}$ which is synchronised to a first clock signal CLK1, can thus allow the time encoded signal to be supplied directly to a counter of some downstream processing circuitry, e.g. as part of an ADC 500, without introducing a quantisation error in the counting. This can avoid the need for very fast clocks for the counters or the use of VCOs or the like for noise shaping, with the associated power and/size requirements. In addition the topology of the TEM 100 described with reference to FIG. 1, where the input signal $S_{IN}$ is supplied to one input of the comparator and the filtered feedback signal is supplied to the other comparator input provides a very compact and low power modulator. Thus embodiments of the present disclosure can be used to enable low power and low size signal processing circuits such as ADCs.

As mentioned above the filter 104 of the TEM 100 illustrated in FIG. 1 may be a simple filter such as an RC filter as illustrated in FIG. 7a, with impedance 701 in series in the feedback path, in this example a resistor (R), and a capacitor (C) 702 coupled between a node the feedback path and a reference voltage, such as ground, so as to the be charged or discharged by the voltage difference across the resistors due to feedback signal $S_{FB}$. FIG. 7a shows a first order RC filter but second or higher order filter could be implemented, for instance by connecting a plurality of filters such as illustrated in FIG. 7a in series. In some embodiments impedance 701 may comprise an inductor.

Other filter arrangements are possible however. For example FIG. 7b illustrates an alternative filter arrangement for the filter 104. The feedback signal $S_{FB}$ is received by current generator 703 which generates a charging or discharging current of a defined magnitude to charge or discharge capacitor 704 based on the state of the feedback signal $S_{FB}$. For example the current generator 703 may have a first current element 705 arranged as a current source to charge the capacitor 704 which is enabled when the feedback signal is in one output state and a second current element 706 arranged as a current sink to discharge the capacitor 704 which is enabled when the feedback signal is in the other output state. A reference voltage $V_R$, which may for instance correspond to the level of a zero magnitude input signal, e.g. the midpoint voltage $V_{MID}$, is also coupled to the capacitor 702, so as to provide an additional charging or discharging current depending on the voltage difference between the reference voltage $V_R$ and the present voltage of the capacitor 704, which as noted previously will be maintained around the level of the input signal $S_{IN}$ by the action of the feedback loop. The voltage of the capacitor 704 will thus ramp-upwards or downwards depending on the state of the feedback signal $S_{FB}$ due to the steering currents +i and −i, but the rate of ramping will depend on the additional charging or discharging current, which depends on the difference between the present value of the filtered signal $S_{FIL}$ and the reference voltage $V_R$.

One practical advantage of the use of a current generator 703 is that avoids the need for voltage buffers to provide accurate voltage levels $V_H$ and $V_L$ in order for example to avoid the effects of power supply voltage variation. Such buffers need to be well designed in order to avoid transient effects as the feedback load is switched from $V_H$ to $V_L$ and vice-versa and thus may require more power and chip area than required for a simple current source whose output may be simply steered from the output node to some other node.

Figure 8A:
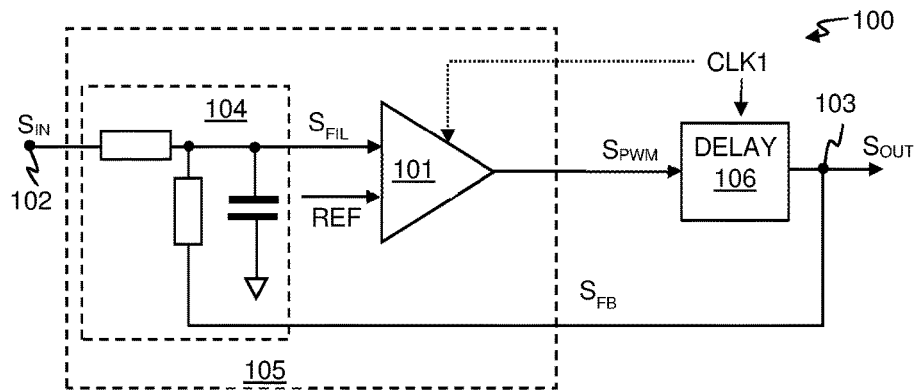
FIGS. 8a and 8b illustrate other examples of time encoding modulators with a delay in the feedback loop.

Other modulator topologies may be implemented in other embodiments. The arrangement illustrated in FIG. 1 may, for instance, be implemented as a non-inverting modulator with the input signal $S_{IN}$ applied to a non-inverting input of comparator 101 and the filtered signal $S_{FIL}$ being applied to an inverting input of the comparator 101. FIG. 8a illustrates an alternative topology for a time-encoding modulator 100, which may for instance be an inverting time-encoding modulator arrangement.

In the example illustrated in FIG. 8a the feedback signal $S_{FB}$ is effectively combined and filtered with the input signal $S_{IN}$. The filtered signal $S_{FIL}$, which in this example thus corresponds to a combination of the input signal $S_{IN}$ and the feedback signal $S_{FB}$ to which filtering has been applied, ramps-up or down depending on the state of the feedback signal $S_{FB}$, but with a ramp rate which varies with the level of the input signal $S_{IN}$ and the feedback signal $S_{FB}$. FIG. 8a illustrates a first order RC filter as the loop filter 104 but other arrangement would again be possible. In this instance the filtered signal $S_{FIL}$ may be compared by comparator 101 to a reference level REF. The reference level REF may be defined by a suitable signal, e.g. a reference voltage, supplied to a second input of the comparator 101 as illustrated in FIG. 8a, but in some implementation the reference REF may be defined by the structure of the comparator itself and thus need not be explicitly provided as a separate signal. The time-encoding modulator of FIG. 8a may behave in generally the same way as illustrated in FIG. 2, although in this instance the filtered signal $S_{FIL}$ will vary around, and be compared, with the defined reference level REF.

In some embodiments the resistor in the feedback path may be replaced by switched current sources similar to the arrangement of FIG. 7b. Resistor 707 may be connected to the input signal, rather than a fixed reference.

In some embodiments the resistor in the feedback path may be replaced by a plurality of switched current sources 703, 703a, 703b, 703c switched by respectively successively delayed versions of the feedback signal $S_{FB}$ ($S_{FB}$, $S_{FB1}$, $S_{FB2}$, $S_{FB3}$) as illustrated in FIG. 7c. The current source outputs may be wired together so that their output currents sum into the filter capacitor 704. This structure provides extra filtering in the feedback path as a finite-impulse-response or transversal filter. The current sources may be of equal value of may be ratioed in values to provide different combined frequency response. This structure also advantageously averages out and thus reduces the effect of short-term random jitter of the first clock signal CK1, and acts to smooth out the step change in total current applied to the output filter node to reduce any kick back into any signal source providing voltage $S_{IN}$. Any mismatch between the current elements merely alters the frequency response and has little effect at low signal frequencies, in contrast to solutions using a digital filter and a multi-bit current DAC where mismatch would introduce quantisation noise into the signal and require complex solutions such as Dynamic Element Matching to suppress this effect.

Figure 8B:
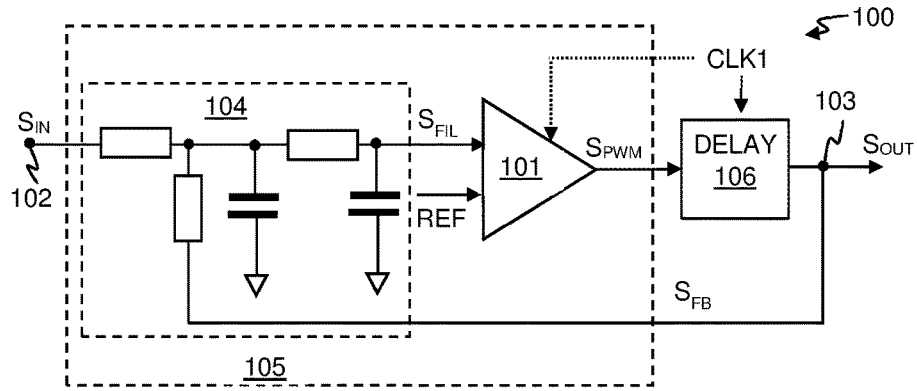

FIG. 8a illustrates a TEM with a first order filter 104, but higher order filters could be implemented. FIG. 8b illustrates an example of a TEM 100 similar to that shown in FIG. 8a but where the filter 104 is a second order filter. The use of higher-order filters may advantageously result in increased noise shaping. The feedback resistor connected to $S_{FB}$ may again be replaced by switched current sources controlled by $S_{FB}$.

Figure 9A:
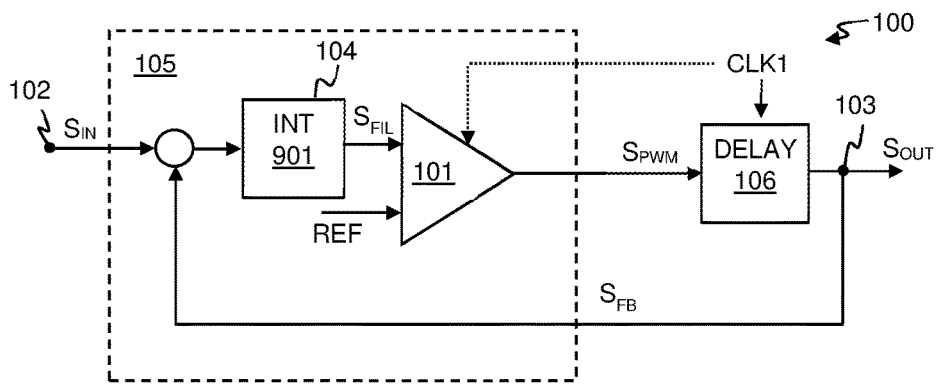
FIGS. 9a and 9b illustrates further examples of a time encoding modulators with a delay in the feedback loop.
Figure 9B:
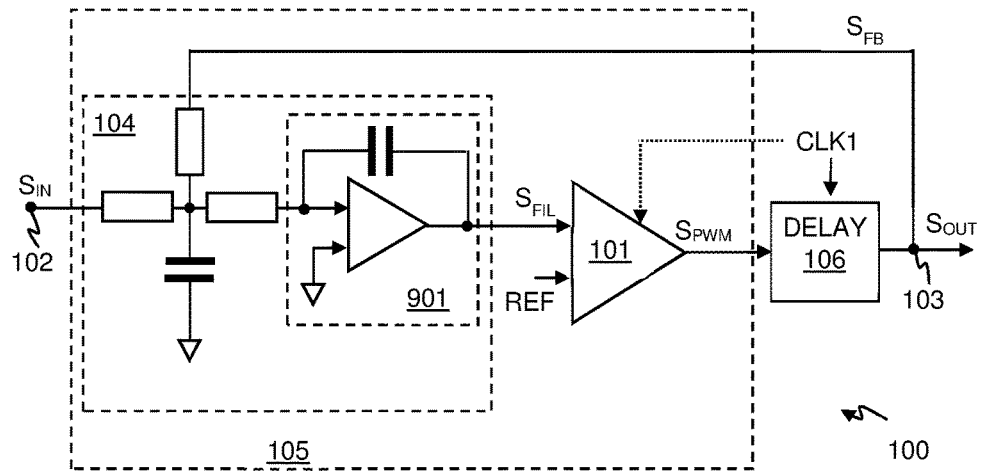

FIG. 9a illustrates a further example of a topology of a time encoding modulator 100. In the example of FIG. 9a the feedback signal $S_{FB}$ is combined with the input signal $S_{IN}$ and the combined signal integrated by an integrator 901, which thus acts as the loop filter 104. The input signal $S_{IN}$ could be combined with the feedback signal $S_{FB}$ in any convenient way, and could be effectively summed or subtracted for example. In either case, the rate of ramping-up or ramping-down of the output of the integrator 901 depends on the combined input signal $S_{IN}$ and feedback signal $S_{FB}$, with the direction of ramping being defined by the state of the feedback signal $S_{FB}$. The arrangement of FIG. 9 is somewhat similar to the arrangement of a conventional asynchronous sigma-delta modulator (ASDM) but in embodiments of this disclosure it includes at least one delay element synchronised to the first clock signal CLK1 and provides an output PWM signal $S_{OUT}$ where any signal transitions are synchronised to the first clock signal CLK1. Again the filtered signal $S_{FIL}$ may be compared with a reference level REF which may be an external reference signal supplied to the compactor 101 or may be an inherent reference due to the design of comparator 101. FIG. 9b illustrates a TEM similar to FIG. 9a but where filter 104 is implemented as a second order filter with an RC filter and integrator 901.

It will of course be understood that some scaling or level shifting could be applied to at least one of the input signal $S_{IN}$, the feedback signal $S_{FB}$ or the filtered signal $S_{FIL}$.

The time encoding modulators of embodiments of the present disclosure thus may encode an input signal $S_{IN}$, such as an analogue audio signal for example, into a time-encoded signal, in particular a PWM signal in which the input signal is encoded as the duty cycle of the PWM signal.

However, as described above with reference to equations (4) and (5), not only do the durations α and β of the pulses of high and low state in the PWM signal $S_{PWM}$ (and consequently the output signal $S_{OUT}$) vary with the level of the input signal $S_{IN}$ but also with the PWM cycle period $T_{PWM}$, and hence PWM cycle frequency $f_{PWM}$, also vary with the input signal $S_{IN}$. Equation (5) shows that the PWM cycle period varies according to $T_{PWM}=4*D/(1-X^2)$. Thus the PWM cycle frequency $f_{PWM}$ varies as $(1-X^2)/4*D$, where D is the delay period and X is the normalised level of the input signal $S_{IN}$.

It can be seen that the PWM cycle period $T_{PWM}$ can increase significantly at higher input signal magnitudes. For instance at a signal magnitude of nine tenths of the maximum signal level, (|X|=0.9) the cycle period will be over five times longer than the limit cycle period $T_0$ at X=0. The PWM cycle frequency $f_{PWM}$ will thus be over five times lower than the limit cycle frequency $f_0$.

This relatively large variation in cycle frequency or period of the output signal $S_{OUT}$ may be disadvantageous in some implementations. For instance any downstream time-decoding components may need to be able to cope with a large range of cycle period, which may add to the complexity of such decoding components. In addition, to ensure that cycle frequency remains sufficiently high at all signals levels may require the limit cycle frequency to be very high, which again may add to the complexity of downstream components. Otherwise, as the cycle frequency reduces at higher signal magnitudes, it could approach the signal band of interest.

To avoid these issues the operation of the time-encoding modulator 100 may be controlled so as to control the cycle period or cycle frequency of the output signal $S_{OUT}$. In some embodiments the delay element(s) 106 of the time-encoding modulator may be variable delay elements that may be controlled to vary the defined delay applied and a controller may be arranged to control the delay applied by the variable delay element(s) so as to control the cycle frequency/period of the time encoded signal.

Figure 10:
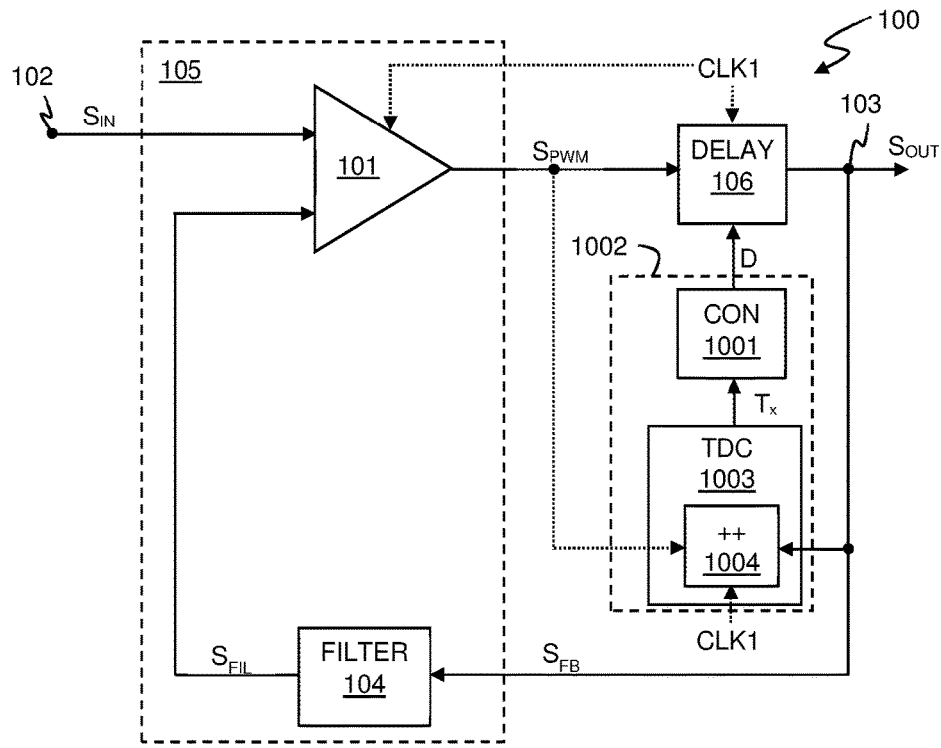
FIG. 10 illustrates one example of a time encoding modulator with a controllably variable delay in the feedback loop.

FIG. 10 illustrates an embodiment of a time encoding modulator 100 with a controller 1001 for controlling the delay applied by the delay element(s) 106 of the modulator. The delay controller 1001 is configured to controllably vary the delay applied within the feedback loop, e.g., to the PWM signal $S_{PWM}$, so as to control the PWM cycle period or cycle frequency of the PWM signal $S_{PWM}$ generated by the modulator and hence the cycle period or frequency of the output signal $S_{OUT}$. The controller 1001 may be seen as, at least part of, a cycle period controller (CPC) 1102 for controlling the PWM cycle period and hence frequency. FIG. 10 illustrates the controlled delay element 106 in the forward signal path between the output of the comparator 101 and the modulator output 103, but a controlled delay could additionally or alternatively be located in the feedback path. FIG. 10 illustrates a modulator topology similar to that illustrated in FIG. 1. It will be understood however that other variants, such as the modulators shown in any of the other figures could be implemented with a variable delay.

FIG. 10 illustrates that a Time-Decoding-Converter (TDC) 1003, which may be part of the CPC 1002 as illustrated or may, in some embodiments, be a downstream component, receives a version of the PWM signal. FIG. 10 illustrates that the TDC 1003 receives the output signal $S_{OUT}$ after any delay by a delay element 106 in the forward signal path. However, in embodiments where the TDC 1003 is provided as part of a CPC 1002 of the modulator, the TDC 1003 may instead receive the PWM signal $S_{PWM}$ output from the comparator 101.

In any event, the TDC 1003 may determine a time parameter $T_X$ of the time encoded signal, e.g. $S_{OUT}$. The time parameter $T_X$ may be any parameter of the time encoded signal $S_{OUT}$ that varies with signal magnitude in a known way. In this example the time parameter $T_X$ may be the present cycle period $T_{PWM}$, although equally the time parameter could be the duration of a pulse of one output state, α or β, or the duty cycle α/(α+β). This time parameter $T_X$ is provided to the controller (CON) 1001. In this example the controller 1001 is configured to controllably vary the delay period D applied by the delay element 106, which is a variable delay element operable to provide a defined delay that may be selectively varied in a known way.

From equation 5 it can be seen that the limit cycle period of a TEM such as illustrated in FIG. 10 depends on the delay period D applied by the delay element(s) 106. The controller 1001 may thus controllably vary the amount of delay D applied in the feedback loop so as to reduce the amount of variation of PWM cycle frequency $f_{PWM}$ with signal level of the input signal $S_{IN}$ and/or to implement desired cycle period/frequency characteristics. For instance the controller 1001 may be configured to maintain the PWM cycle period, and hence frequency, within a defined range in operation, e.g. above a certain minimum frequency. Thus the controller 1001 may be configured to reduce the delay D applied by delay element 106 as the magnitude of the input signal increases, as indicated by the time parameter $T_X$, so as to maintain the cycle period, and hence the cycle frequency, within a defined range. For a given delay period D, an increase in magnitude of the input signal $S_{IN}$ would lead to an increase PWM cycle period $T_{PWM}$ and hence a reduced PWM frequency $f_{PWM}$. However reducing the delay period D results in the PWM cycle period being reduced and thus may maintain the PWM cycle frequency above a desired limit.

The controller 1001 may thus reduce the amount of delay as the magnitude of the input signal $S_{IN}$ increases, and vice-versa, in order to reduce the variation in the cycle period $T_{PWM}$. In some instances the delay may be generally controlled according to:

$$D = D_0 * (1 - X_e^2) \qquad \text{(eqn. 6)}$$

where $D_0$ is the delay applied at zero signal magnitude and $X_e$ is an estimate of the normalised signal X, derived from the time parameter $T_X$, for example the duty cycle $\alpha/(\alpha+\beta)$.

There are many ways the delay applied by a delay element may be controllably varied as will be understood by one skilled in the art. For example, for the delay element 106 illustrated in FIG. 4*b*, the delay period D may be readily controlled by controlling the reference value $N_D$ supplied to the digital comparator 406. Controlling the delay period of such a delay element 106 is thus very simple to implement and is an advantageous way to control the cycle period/frequency characteristics of the time-encoding modulator.

However the principles of controlling a delay applied by a variable delay element in a feedback loop of a self-oscillating time-encoding modulator may be advantageous even if the output signal $S_{OUT}$ is not constrained, e.g. latched, to be synchronised to a clock signal. The control of a delay applied by a variable delay element in a feedback loop of a self-oscillating time-encoding modulator so as to provide control over the cycle frequency of an output represents another novel aspect of the present disclosure.

Thus in some embodiments the comparator 101 and delay element 106 may not be arranged to constrain any signal transition in the output signal $S_{OUT}$ to be synchronised to a clock signal. In such a case any delay element that provides a controlled variable delay could be implemented as delay element 106. For example, as illustrated in FIG. 4*a*, a series of individual delays could be arranged in series as a delay line and tap points from different parts of the delay line could be fed into a multiplexor. The multiplexor could be controlled to vary the relevant tap point which is provided to the output and thus vary the delay applied. One skilled in the art will be aware of other types of variable delay element that could be implemented.

Figure 11A:
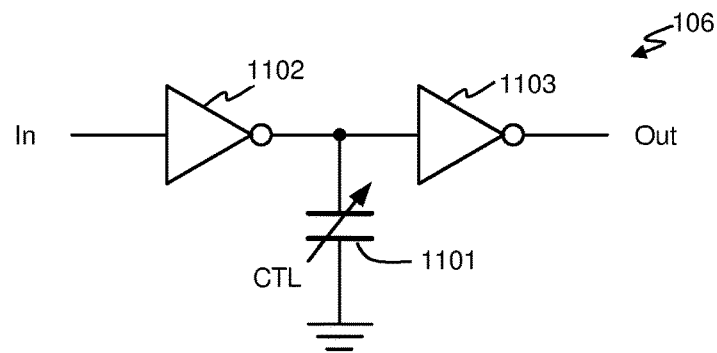
FIGS. 11a and 11b show examples of variable analogue delays.
Figure 11B:
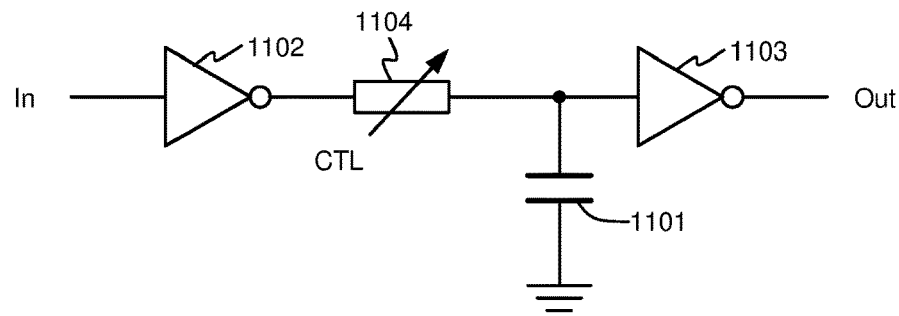

In some implementations the variable delay element 106 may comprise an analogue delay. For example FIG. 11*a* illustrates a variable analogue delay 106 comprising a capacitance 1101 coupled to the signal path between two series connected inverters 1102 and 1103. The capacitance 1101 is coupled between the signal path and ground. When a signal transition at the input causes the output of the first inverter 1102 to change state, there will be a delay whilst the capacitance is charged or discharged to a level sufficient to cause the output of the second inverter 1103 to also change state. The delay depends on the drive strength of the inverters and the value of capacitance 1101. In this example the capacitance 1101 is a variable capacitance and may for instance be a digitally programmable capacitance. Additionally or alternatively, as illustrated in FIG. 11*b*, there may be a variable resistance 1104 through which the capacitance 1102 is charged or discharged. Again the resistance may be a digitally programmable resistance. Thus in some embodiments a variable analogue delay element may be controlled, possibly digitally controlled, to provide a variable delay. In some embodiments the analogue variable delay could be provided in additional to a digital delay within the feedback loop.

Referring back to FIG. 10, in some embodiments the TDC 1003 could be provided as part of a cycle period controller (CPC), and thus principally provided for the purpose of controlling the cycle period/frequency of the time-encoded signal output from the modulator 100. For control of the cycle frequency/period a relatively accurate or precise indication of the level of the input signal may not be needed and it may be sufficient to determine the cycle period $T_{PWM}$ relatively crudely. The TDC 1003 may, in some embodiments comprise a counter 1004 which is clocked by a clock signal, which, in embodiments where the delay elements are synchronised to a first clock signal CLK1, may conveniently be the first clock signal CLK1. The counter 1004 may be configured to determine at least one count value of the number of clock cycles of the first clock signal CLK1 in a period corresponding to the relevant time parameter, for instance the counter 1004 may count the number of clock cycles in each period between successive rising edges in the output signal $S_{OUT}$ and provide the cycle-by-cycle count value as the measure $T_X$ of the cycle period $T_{PWM}$.

In some embodiments however there may be TDC arranged to receive the output signal $S_{OUT}$ as part of some downstream processing circuitry and in some embodiments the CPC 1002 may be configured to receive an indication of the time parameter $T_X$ or an indication of the level of the input signal from some downstream processing circuit.

For example, referring back to FIG. 5, the ADC circuit 500 may comprise frequency cycle period controller 506 for controlling at least one parameter P of the TEM 100 so as to control the cycle frequency/period of the output signal $S_{OUT}$. At least one parameter that may be controlled by CPC 506 may be the delay applied in the feedback loop by one or more delay elements 106. The CPC 506 may receive an indication of a time parameter determined by the counter 502 of the TDC 501 or may receive the digital signal $D_{OUT}$ which is demodulated by the demodulator 503.

Controlling parameters of the TEM 100, such as the applied delay D, may allow the cycle period of the output time-encoded signal $S_{OUT}$ to be controlled to remain substantially constant. In some instances this may provide some benefits for the demodulation of the time encoded signal. For instance the TDC 501 could generate a sample value according to the determined count values as $\alpha-\beta$. This value is indicative of the duty cycle of the time-encoded signal $S_{OUT}$, and hence the input signal $S_{IN}$, but is scaled non-linearly due to the varying cycle period. If the modulator 100 is, however, controlled so that the cycle period does not vary substantially the non-linearity may be relatively low and the value $\alpha-\beta$ could be used as the indication of signal level. The count of $\alpha-\beta$ could only be determined at the end of each cycle and the timing of the cycles may vary slightly, i.e. the sample rate would be irregular. The count value $\alpha-\beta$ could be supplied to an asynchronous sample rate converter to converter the irregular sample rate signal to a regular sample rate signal, e.g. by interpolation, as will be understood by one skilled in the art.

Thus controlling the delay applied in this way may allow the cycle period of the time-encoded signal $S_{PWM}$ to be controlled to remain substantially constant on a cycle-by-cycle basis. Additionally, or alternatively, the timing control could be used to enable operation in different modes, for instance to provide a trade-off between performance and power consumption. For example the limit cycle frequency of the time-encoded signal could be reduced to save power under conditions when there is little apparent input signal activity or based on some other characteristic, feature, indication and/or control of the input signal. A characteristic, feature, indication and/or control of input signal activity could, in some implementations, be detected autonomously, for example, by filtering or envelope detecting a demodulated output signal. Additionally or alternatively an indication of signal activity or a command to alter an operating mode may be received by an explicit control input from a controller in the host system. For an embodiment such as described with reference to FIG. 10, where the applied delay may be adaptively be controlled cycle-by-cycle (for at least one operating mode), the limit cycle frequency might be altered by altering the target cycle period directly or more indirectly for example by altering the value of the delay applied for a signal of zero magnitude. Additionally or alternatively in at least some modes of operation the applied delay may not be controlled on a cycle-by-cycle basis but a particular value of delay may be applied so as to implement a desired mode of operation.

The time encoding modulator 100 may thus be operable in at least a first mode with a limit cycle frequency, i.e. cycle frequency at a quiescent input signal level, of a first frequency and a second mode with a limit cycle period of a second, different, frequency, wherein the CPC 506 is operable to vary a parameter of the TEM 100, such as the applied delay for example, so as to implement the first and second modes. The first mode may be a higher power and/or high performance mode than the second mode with the first frequency being higher than the second frequency. In the first mode the CPC 506 may, in some implementations, be operable so that the cycle period is controlled to be with a first defined range on a cycle-by-cycle basis, i.e. to provide adaptive control. In the second mode the parameter, such as the applied delay for example, may be fixed, as the second mode may correspond to a mode of operation for low signal activity, although in some implementation adaptive frequency control on a cycle-by-cycle basis may also be implemented in the second mode. In some implementations the cycle period controller 506 may thus also operate as a mode controller.

For example, the circuit could be designed such that the limit cycle frequency is controlled to be a relatively low frequency, say 100 kHz, for input voltage signal activity smaller than a defined low level, say −30 dBV, but to increase linearly to a relatively higher frequency, say 1 MHz, for signals at a defined upper limit of say 0 dBV.

It will also be appreciated that the frequency of the first clock signal CLK1, which is used to clock the counter 502 of TDC 501 should be sufficiently fast to provide sufficient accuracy for determining the duty-cycle of the time-encoded signal. A relatively high cycle frequency may thus require a relatively fast first clock signal CLK1 to determine the duty-cycle to a sufficient accuracy. However a relatively lower cycle frequency, i.e. a longer cycle period α+β, allows the duty cycle to be determined to the same proportional error with a relatively slower clock. The frequency of the first clock signal CLK1 may thus be reduced to provide similar accuracy in the lower-power mode of operation, or may be reduced further to deliberately provide a lower accuracy in the lower-power mode of operation.

The use of a time-encoded modulator 100 where the transitions of the output time-encoded signal $S_{OUT}$ are synchronised to a first clock signal CLK1 allows the time-encoded signal $S_{OUT}$ to be supplied directly to counter 502 as discussed above. However this operation could, in some instances, result in unwanted tones appearing in the time-encoded signal $S_{OUT}$ and hence the digital output $D_{OUT}$. In some embodiments therefore some dither, i.e. some intentionally applied form of noise so as to randomize quantization error, may be applied to the time-encoded signal $S_{OUT}$ so as to avoid or reduce the presence of such unwanted tones. In some embodiments dither may be applied by applying dither to the parameter(s) P controlled by the CPC 506 of the time-encoding modulator 100, for instance by applying dither to the value of the delay D applied. Dithering the delay applied, i.e. varying the amount of delay D applied in a controlled way, will mean that a given input signal level will result in first durations α and β at a first time (with a first applied delay) but the same signal level would result in second, different, durations α and β at a second time (when at a different delay is applied). Thus the chance of constant or regular signal components leading to unwanted tones is reduced.

The adaptive timing controller, i.e. cycle period controller 506, may thus vary a parameter, such as the delay applied by delay element(s) of the time-encoding modulator in a controlled way, for instance in response to a received dither signal. Dither may be applied whether or not the cycle period controller 506 is configured to control the cycle period within a defined range, i.e. the cycle period controller 506 may apply dither and/or to maintain the cycle period in a defined range.

Figure 12:
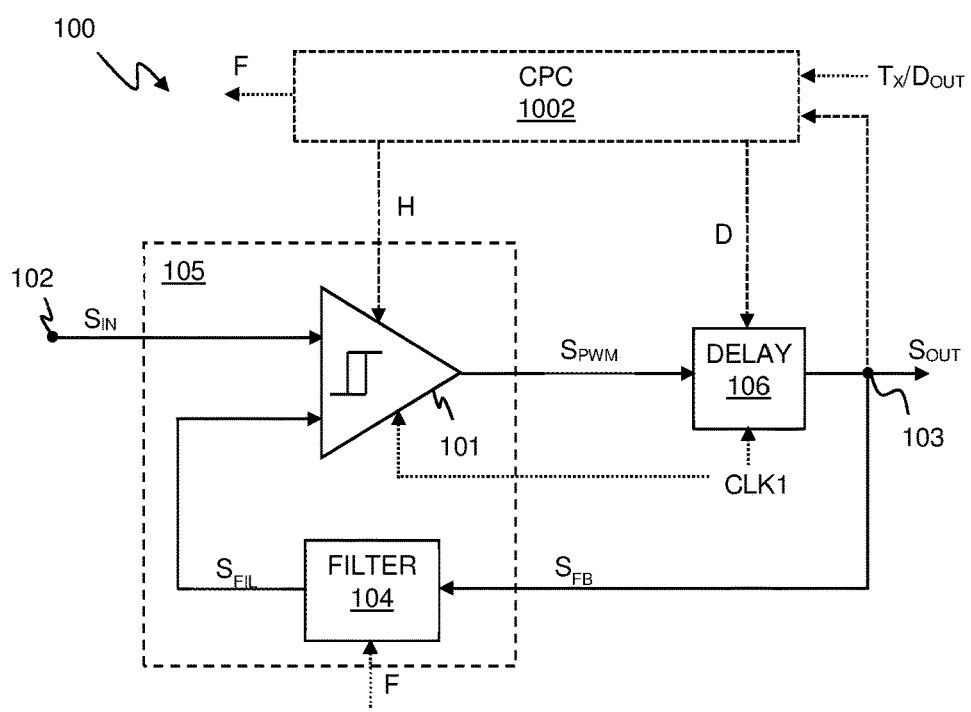
FIG. 12 illustrates one example of a time encoding modulator with a delay in the feedback loop and a hysteretic comparator.

In the embodiments discussed above the limit cycle of the PWM signal $S_{PWM}$ is substantially defined by the delay D applied in the feedback loop of the TEM. In some embodiments however the comparator 101 may be operable, in at least some operating modes, as a hysteretic comparator so as to apply a degree of hysteresis to the comparison. FIG. 12 shows an example of a time-encoding modulator 100 in which the comparator 101 is a hysteretic comparator, for instance an op-amp comparator configured to provide hysteresis as will be understood by one skilled in the art. FIG. 12 illustrates a modulator topology similar to that illustrated in FIG. 1. It will be understood however that other variants, such as the modulators shown in any of the other figures could be implemented with a hysteretic comparator.

As will be understood by one skilled in the art, a hysteretic comparator is configured to apply hysteresis so that a signal level, which is required for the comparator to swap from a first output state to the second output state, is different to signal level required for the comparator to swap from the second output state back to the first output state. Thus, the filtered signal $S_{FIL}$ may need to reach a first signal level, i.e. a first threshold Th1, to transition from the first output state to the second output state and reach a second, different, signal level, i.e. a second threshold Th2, to transition back to the first output state. For the example of FIG. 12 the first and second thresholds are effectively defined with respect to the present level of the input signal $S_{IN}$, or alternatively could be seen as thresholds for the difference between the signals supplied to the comparator. For example, the first defined threshold Th1 may be a defined amount above the present level of the input signal $S_{IN}$ and the second defined threshold Th2 may be a defined amount below the present level of the input signal $S_{IN}$. For other modulator arrangements the threshold Th1 and Th2 may be defined with respect to the reference REF. The difference between the thresholds Th1 and Th2 can be seen as the amount of hysteresis H applied by the hysteretic comparator 101.

The hysteresis H applied thus defines a minimum amount of change required in the filtered signal $S_{FIL}$ for the output of the comparator 101 to change state. The amount of change required may be the same whether the filtered signal is ramping-up or down, i.e. from Th1 to Th2 or vice versa. As such the time taken from the filtered signal $S_{FIL}$ to change by the amount defined by the hysteresis will depend on the ramp rate of the filtered signal $S_{FIL}$ in each state.

Applying hysteresis in the comparison by comparator 101 may thus be used instead of a delay in the feedback loop of a modulator, to provide self-oscillation with particular cycle period/frequency characteristics. In embodiments of the present disclosure however a time encoding modulator may comprise both a comparator operable to apply hysteresis and a delay element operable to apply a controlled delay in the feedback loop. This provides a self-oscillating time encoding modulator where both the hysteresis and the applied delay contribute to the limit cycle characteristics of the time-encoded signal.

Figure 13:
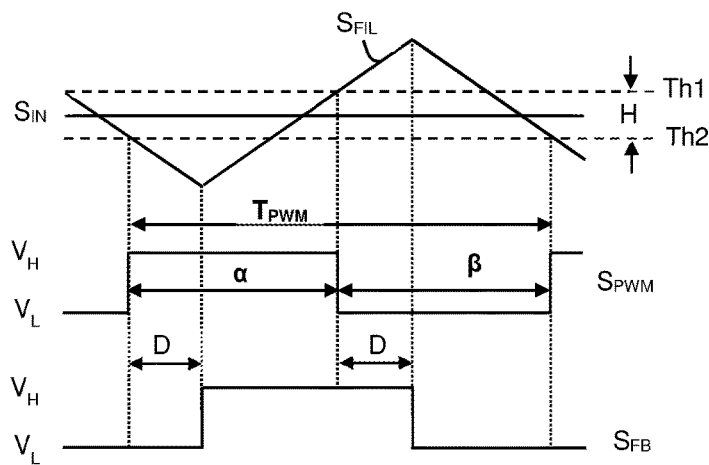
FIG. 13 illustrates the principle of operation of a time encoding modulator applying both delay and hysteresis in the feedback loop.

FIG. 13 illustrates the principle of operation of the time-encoded modulator 100 of FIG. 12. FIG. 13 illustrates similar waveforms to those in FIGS. 2a and 2b, but include the effect of hysteresis. In the example of FIG. 13 the feedback signal $S_{FB}$ is initially in the low state and the level of the filtered signal $S_{FIL}$ is ramping-down. The filtered signal $S_{FIL}$ ramps-down to the level of the input signal $S_{IN}$, but in this example the output state of the comparator only change state when the filtered signal $S_{FIL}$ reaches a threshold Th2 which is a defined amount lower than the input signal. At this point the PWM signal $S_{PWM}$ output from the comparator changes state. However as discussed above this change in state in the PWM signal $S_{PWM}$ does not propagate to a change in state of the feedback signal $S_{FB}$ until after the delay period D, and during the delay period the filtered signal $S_{FIL}$ continues to ramp-down. After the delay period D, the change in state propagates to the feedback signal $S_{FB}$ and thus the filtered signal $S_{FIL}$ starts to ramp-up. However the PWM signal $S_{PWM}$ output from the comparator will remain in the low state until the filtered signal $S_{FIL}$ reaches a signal level Th1. The filtered signal $S_{FIL}$ thus needs to ramp-up by an amount equal to the amount of 'overshoot' during the delay period and also the amount of hysteresis applied. At this point the PWM signal $S_{PWM}$ output from the comparator 101 changes state, but again the change in state does not propagate to the feedback signal until after the delay period and during the delay period the filtered signal continues ramping-upwards.

In a similar manner as discussed above the comparator 101 thus outputs pulses of first and second output states, e.g. high and low, of durations α and β, with relative durations that depend on the ramp rate of the filtered signal $S_{IN}$ in each state and thus in the level of the input signal $S_{IN}$. This provides a PWM signal $S_{PWM}$ with a duty cycle that depends on the input signal $S_{IN}$, but in this case the limit cycle period, and hence frequency, depends on both the applied delay D and the applied hysteresis H.

One skilled in the art would conventionally consider hysteresis H or delay D to be alternative approaches for providing a self-oscillating modulator and would implement one or the other depending on the particular application. One novel aspect of the present disclosure is a time-encoding modulator which applies both delay D and hysteresis H.

Using both a hysteretic comparator and a delay element in the feedback loop of a time encoding modulator such as illustrated in FIG. 12 can be advantageous in relaxing design constraints of the modulator as compared to the use of hysteresis H or delay D alone.

It will be appreciated that if hysteresis H alone were applied, with effectively no delay D applied in the feedback loop, any change in state of the PWM signal $S_{PWM}$ would propagate to a change in state of the feedback signal $S_{FB}$ without any substantial delay. Thus as soon as the filtered feedback signal $S_{FIL}$ reached one threshold, say Th1, the state of the PWM signal $S_{PWM}$ and the feedback signal $S_{FB}$ would change, and the filtered signal $S_{FIL}$ would start ramping in the other direction. The value of the filtered signal $S_{FIL}$ would thus vary between Th1 and Th2. The durations α and β of the pulse of the various state would, to first order, be given by:

$$\alpha = T_0/2*(1-X) \quad \beta = T_0/2*(1+X) \quad \text{(Eqn. 7)}$$

where X in the level of the normalised input signal and $T_0$ is the limit cycle period for an input signal of zero magnitude. In this instance the limit cycle period will depend on the amount of hysteresis H and the properties of the filter that define the ramp rate. For an RC filter such as illustrated in FIG. 7a the limit cycle period is given by:

$$T_0 = 2*R*C*\ln\{(1+H/(2*S_M))/(1-H/(2*S_M))\} \quad \text{(Eqn. 8)}$$

where R is the resistance of impedance 701, C is the value of capacitance 702 (and R*C is the time constant of the filter arrangement), H is indicative of the amount of hysteresis applied and $S_M$ is the magnitude of the feedback signal defined as $(V_H-V_L)/2$.

If the modulator were implemented such that hysteresis H was applied, without any substantial delay D being applied, the amount of hysteresis applied would typically be seen as the main design choice for controlling the limit cycle period. Thus if a particular limit cycle period were desirable for a particular application, this would translate to a required amount of hysteresis. In practice the requirement for a specific amount of hysteresis to be applied by the hysteretic comparator may limit the design freedom for the comparator and thus restrict the type of comparator that may be implemented. In some instances it may be challenging to provide a hysteretic comparator that provides a sufficient amount of hysteresis in an accurate and stable way, at least without requiring components that may be relatively large or have relatively high power consumption.

Likewise, from equation (5) above, for a time encoding modulator with a delay D applied in the feedback loop, but no hysteresis H, the limit cycle period depends on the delay applied. Again providing a suitable delay to implement a desired limit cycle period may impose limitations on the type of delay and how it is implemented. For instance if the delay were a digital delay including a counter, it may be necessary for the counter to be able to count to a sufficient value to implement the required delay. In addition if the delay is a digital delay that applies a delay equal to an integer number of clock periods, then there are only certain delays that can be implemented—those that correspond to integer multiples of the clock period of the first clock signal CLK1.

In embodiments of the present disclosure the use of both hysteresis H and delay D may relax the requirements for both the hysteresis applied and the delay applied and thus mean that suitable components may be implemented more readily. For example a digital delay may be implemented to provide a delay D that corresponds to an integer number of clock periods of the first clock signal CLK1, such an arrangement, as described above, may be implemented readily using digital components but may not provide exactly the delay period required given the first clock signal available. However the comparator 101 may be configured to apply an amount of hysteresis H to provide the resulting desired limit cycle period. This may allow the comparator 101 to be implemented with a relatively lower amount of hysteresis than otherwise would be required, which may be easier to provide.

The hybrid approach of applying hysteresis H and a controlled delay D in the feedback loop of a time encoding modulator may therefore allow desired cycle period characteristics, e.g. limit cycle period or frequency, to be achieved whilst potentially easing the requirements for the comparator and/or delay element and allowing a greater design flexibility in tailoring the combination of the hysteresis and delay.

In some embodiments at least one of the applied hysteresis H and the applied delay D may be variable and may be controlled so as to control the characteristics of the output signal $S_{OUT}$, e.g. the PWM cycle frequency $f_{PWM}$. In some embodiments the delay D and/or hysteresis H may be controlled to implement different operating modes as discussed above. In some embodiments the delay and/or hysteresis may be controlled to control the variation in the PWM cycle frequency $f_{PWM}$ in operation.

Referring back to FIG. 12 in some embodiments the modulator 100 may include a cycle period controller (CPC) 1102 such as discussed with respect to FIG. 5. In the embodiment of FIG. 12, the parameters of the modulator 100 that are adapted by the CPC 1102 so as to control the cycle period/frequency of the PWM signal $S_{PWM}$ may include the delay D applied by a delay element 106 and/or the hysteresis H applied by a comparator 101. In some embodiments the CPC 1102 may control the relevant parameter(s), e.g. the applied delay D and/or the applied hysteresis H based on the time encoded signal. The modulator 100 may comprise a TDC and may receive a version of the time-encoded signal, which could be $S_{OUT}$ as illustrated or, in some implementations, could be $S_{PWM}$. Alternatively as discussed with respect to FIG. 5 the CPC 1102 could receive a characteristic, feature, indication and/or control of the time-encoded signal from a downstream component, such as a timing parameter $T_X$ or demodulated digital value $D_{OUT}$ from a downstream TDC 501.

In some embodiments the amount of hysteresis H applied may be fixed and the amount of delay D applied may be variable and controlled by the CPC 1102. Providing a comparator that applies a fixed amount of hysteresis avoids the need to ensure the comparator 101 operates satisfactorily for a range of hysteresis values and allows the comparator 101 to be optimised for that particular value of hysteresis. As noted above in some embodiments a variable delay may be readily achieved by implementing a counter type arrangement for delay element 106.

In some embodiments the amount of delay D applied may be fixed and the amount of hysteresis H applied may be variable and controlled by the CPC 1102. If the delay element 106 is not a digital delay, it may be simpler to use a delay element that provides a defined fixed delay D and control the cycle period of the PWM signal $S_{PWM}$ via the hysteresis H applied by comparator 101. The use of at least some fixed delay D in the feedback loop of the modulator may however relax requirements on the range of hysteresis H values required in use.

In some embodiments however both the applied delay D and the applied hysteresis H may be controllably varied by the CPC 1102. Thus in some embodiments both the applied delay D and the applied hysteresis H may be controlled based on the time-encoded signal generated by the modulator.

Varying both the applied delay D and the applied hysteresis may provide more flexibility in the control of the cycle period/frequency.

For example, as noted above in some implementation the digital delay elements 106 may be a digital delay element such as illustrated in FIG. 4a or FIG. 4b, wherein a controlled delay is applied as an integer number of clock periods of the a clock signal. The delay may be controlled to vary the number of clock periods of the delay. It will be appreciated however that in such an arrangement the delay can only be varied in steps corresponding the duration of a clock period of the clock signal.

From equation (5) above, the PWM cycle period (with no hysteresis H applied) is given by $T_{PWM}=4*D/(1-X^2)$ and thus the limit cycle period $T_0$ is equal to 4*D. For illustration purposes consider that the delay is set to 25 clock periods (for low level input signals), so that the limit cycle period $T_0$ corresponds to 100 times the clock period (it will of course be understood that in practice the actual number of clock periods used for the delay could be quite different to this illustrative case). The limit cycle frequency would thus be equal to $f_{CLK}/100$ where $f_{CLK}$ is the clock frequency. If the input signal level goes to a magnitude of X=0.9, the limit cycle period increases by a factor of 5.26 and the PWM cycle frequency $f_{PWM}$ would drop by the same factor. If it were desired to provide the same PWM frequency at this signal level, this would require the delay to be reduced by the same factor, which would correspond to a delay equal to 4.75 clock periods. In this example the delay can only be changed to an integer number of clock periods and so the delay may be set to 5 clock periods. The resulting PWM cycle period would thus be equivalent 105.2 clock periods, which is 5% off the desired PWM cycle period and hence frequency.

In embodiments of the present disclosure the delay period D may be controlled to provide some control over the cycle period of the PWM signal, for instance control over the applied delay D may be seen as a first, relatively coarse, degree of control, with the amount of hysteresis H applied being controlled to provide a different degree of control, for example what may be seen as a relatively fine degree of control. For example in the illustrative case discussed in the paragraph above, the delay period could be reduced to 4 clock periods, which only its own would lead to a shorter PWM cycle period than required, but some hysteresis introduced to increase the PWM cycle period to the desired value. In practice however for quiescent signal levels the modulator may be configured to apply a certain delay $D_0$ and also a certain amount of hysteresis $H_0$ so that the amount of hysteresis can be increased or reduced depending on any corresponding change in the applied delay.

Figure 14:
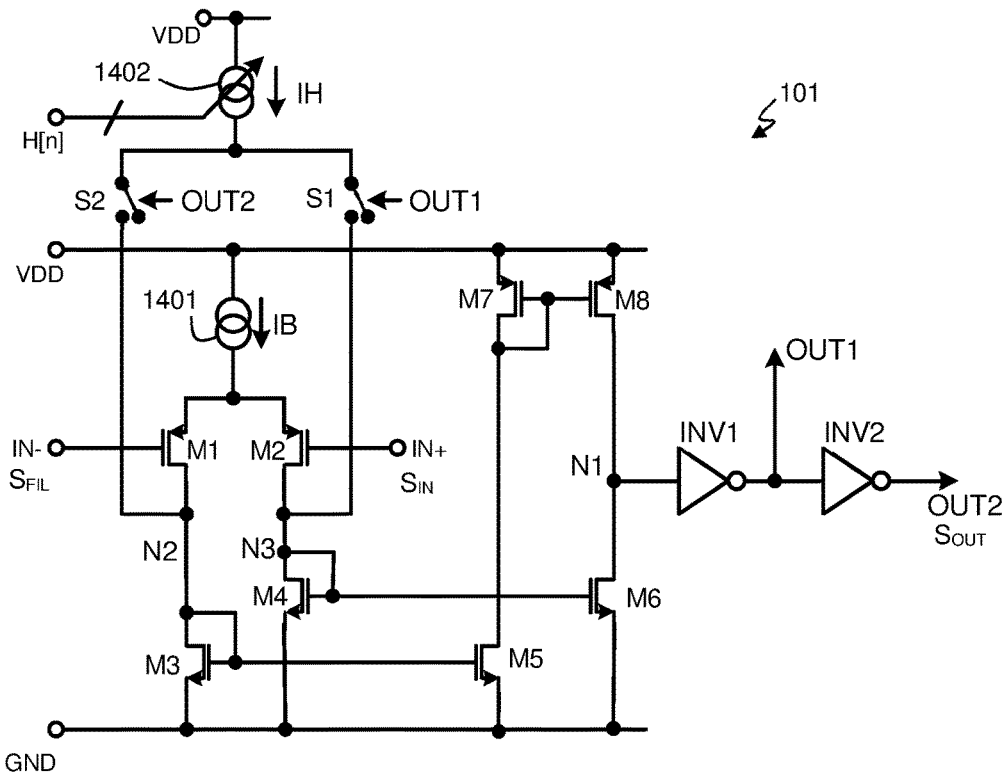
FIG. 14 illustrates one example of a hysteretic comparator.

FIG. 14 illustrates one example a simple hysteretic comparator circuit 101 with programmable hysteresis. MOS transistors M1 to M8 are arranged as a differential-input MOS comparator with a first input (IN+) and a second input (IN−). When used in an embodiment such as illustrated in FIG. 12, the first input (IN+) may receive the input signal $S_{IN}$ and the second input (IN−) may receive the filtered signal $S_{FIL}$. Bias current source 1401 outputs a bias current IB to both input branches, i.e. M1, M3 and M2, M4. The operation of the differential-input MOS comparator with bias source 1401 would be such that, if the voltages at the first and second inputs IN+ and IN− were equal then (assuming, for simplicity of explanation, that all respective transistor widths W and lengths L are equal) each of the eight transistors M1 to M8 would pass a current equal to IB/2 due to the current mirroring arrangement of the circuitry. In particular, transistors M8 and M6 would pass exactly the same current, IB, and node N1 will be ideally mid-way between the supply voltage VDD and a reference voltage, in this case ground. If the voltage at the first input IN+ increases relative to the voltage at the second input IN−, i.e. goes higher, the voltage on node N1 will go high. Conversely, if the voltage at the first input IN+ were to decrease below the voltage at the second input IN− the voltages at node N1 will go low. The voltage at node N1 is buffered to provide the output signal $S_{OUT}$. The voltage at node N1 is buffered by series connected inverters INV1 and INV2 to provide output signals OUT1 and OUT2, where OUT2 is in phase with the voltage at node N1 and OUT1 is an inverted version. The output signal $S_{OUT}$ may be derived from the buffered output OUT2. Were the comparator implemented by transistors M1 to M8 operated just with bias source 1401, the switching point, i.e. the point at which the comparator output would change state, would be the point at the voltages at the first and second input IN+ and IN− are equal. The operation of the comparator circuitry would be symmetric in that the change from low-to-high would occur at the same point as the change from high-to-low.

In addition to this symmetric comparator circuitry, the hysteretic comparator circuit 101 also includes current source 1402 that outputs a current IH and switches S1 and S2 (typically implemented using MOS transistors). In operation, if OUT2 is high, indicating that voltage at the first input IN+ has been higher than that at the second input IN−, then switch S2 closes and allows current IH to be injected into node N2. In order for both M3 and M4 to now pass equal current, (equal to (IB+IH)/2) then transistor M1 must carry a current equal to IB/2−IH/2 and transistor M2 must carry a current equal to IB/2+IH/2. Thus the switching point is now such that second input IN− must be at a relatively higher voltage than the first input IN+ rather than just equal.

The amount of hysteresis is dependent on the magnitude of current IH, increasing with IH, and on the transconductance of input transistors M1 and M2. Thus IH may be provided as a digitally programmable current source (e.g. comprising a plurality of MOS current sources in parallel, with bits of a digital word H[n] either turning each element on or off or steering the respective currents to N2 and/or N3. In some embodiments switches S1 and S2 may comprise multiple switches in parallel to a plurality of current sources of equal or say binary-weighted magnitudes, controlled by a logical combination of OUT, OUTB and H[n].

It will be appreciated that when the comparator 101 applies hysteresis to the comparison, the contribution of the hysteresis to the PWM cycle period $T_{PWM}$ depends on the amount of hysteresis applied but also the ramp rate of the filtered signal $S_{FIL}$, which in turn depends on the properties of the filter 104. For example from equation 8 above it can be seen that the time constant RC of a filter such as shown in FIG. 7a will affect the contribution to the cycle period. In some embodiments the parameter(s) controlled by an adaptive timing controller or cycle period controller 1102 may comprise at least one filter parameter F. For instance for an RC filter such as illustrated in FIG. 7a the value of the resistance R and/or capacitance C may be variable and could be controlled to vary the time constant of the filter so as to provide a degree of control over the cycle period/frequency of the PWM signal $S_{PWM}$. For a filter such as illustrated in FIG. 7b the define value of the currents generated by the current generator 703 could be controllably varied. For a modulator having an integrator 901 such as illustrated in FIG. 9 a gain factor of the integrator could be controllably varied, for example by varying the value of component resistances and/or capacitances. One skilled in the art will be aware of various filter parameters that could be varied for the relevant filter so as to controllably vary the ramp rate of the filtered signal.

Thus in some embodiments the time encoding modulator 100 may include a cycle period controller (CPC) operable to control at least two parameters or variables of the modulator so as to control the cycle period of the time encoded signal, for example within a certain range or defined limits. In some embodiments one parameter is the delay applied by a variable digital delay element, and the digital delay may be varied as an integer number of clock periods of the first clock signal. The other parameter may be a parameter of some analogue element, such as the amount of hysteresis applied by a hysteretic comparator. Additionally or alternatively one parameter could be a parameter that varies the amount of delay applied by an analogue delay element, such as the capacitance of the analogue delay element illustrated in FIG. 11a or the resistance of analogue delay element illustrated in FIG. 11b. In some embodiments the feedback loop may comprise both a variable analogue delay, such as illustrated in FIG. 11a or 11b, and a variable digital delay such as illustrated in FIG. 4a or 4b and both delays could be controlled to provide a desired overall delay. The digital delay could be controlled to provide a relatively coarse control with the analogue delay being controlled to provide a fine control in a similar manner as described above with respect to control of hysteresis and a digital delay.

Figure 15:
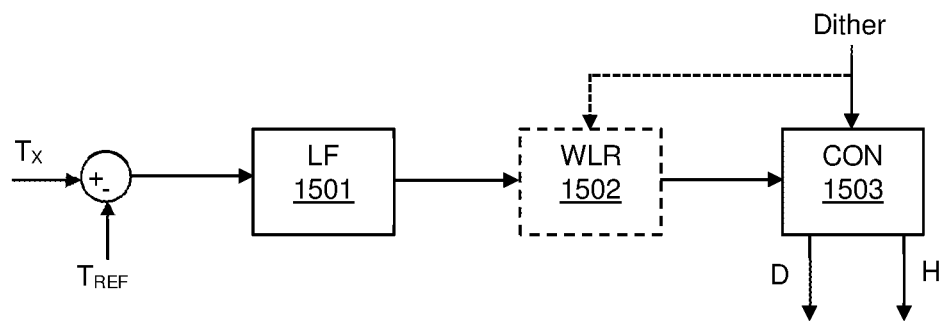
FIG. 15 illustrates one example of a control loop for a cycle period controller.

There are various ways in which a cycle period controller (CPC) may be implemented to control two parameters of the TEM 100, e.g. such as the CPC 1002 of FIG. 12. FIG. 15 illustrates one example of a control loop for control of the parameters of the TEM. An indication of a timing parameter $T_X$ of the time-encoded signal, which may for instance be an indication of the present cycle period $T_{PWM}$, is received and the difference from a reference or target cycle period $T_{REF}$ is determined. This difference or error may be filtered by a loop filter 1501 such as an integrator or a PID (proportional-integral-derivative) module. The output of the loop filter 1501 may be a digital word of a relatively high number of bits, say 16 bit or so in some implementations. Thus a word length reduction (WLR) block 1502, such as a quantizer or delta-sigma modulator, may reduce the number of bits to a desired level, e.g. a 4-bit signal may be appropriate in some implementations. The output of the WLR block 1502, which is indicative of the error between the target cycle period and the present cycle period of the time encoded signal is passed to a parameter controller 1503.

In some implementations the parameter controller 1503 may simply divide this indicative error signal from the WLR block 1503 into two signals, one comprising the most significant bits (MSBs) and the other the least significant bits (LSBs). The MSB signal is used for the coarse cycle period control, in this example to control the digital delay. The LSB signal is used for the fine cycle period control, in this example to control the hysteresis applied.

In other implementations the parameter controller 1503 could comprise a segmented DEM (dynamic element matching) controller. A segmented DEM, as will be understood by one skilled in the art, varies the controller output so as to alternate between the various available control codes so as to maintain a desired average value. Where the parameter controller 1503 comprises a segmented DEM it may provide the functionality of word-length reduction and a separate WLR block may not be required.

Dither may applied by the parameter controller 1503, e.g. based on a received dither control signal. This applies dither to the cycle period of the time encoded signal to avoid unwanted tones from the input signal folding into the signal band of interest. Additionally or alternatively, dither may also be applied to a WLR block present.

In some implementations it may additionally or alternatively be useful to apply at least some dither to a demodulator used to demodulate the time-encoded signal output from the TEM, such as illustrated in FIG. 6c. This can help avoid unwanted tones due to variation in the limit cycle of the time-encoded signal.

Embodiments of the present disclosure thus provide a time-encoding modulator 100 based on a self-oscillating modulator having a comparator module 105 with a comparator 101 and a filter 104 in a feedback loop. The comparator module 105 receives an input signal of interest $S_{IN}$ and also a feedback signal $S_{FB}$ from the modulator output, and generates a time encoded signal $S_{PWM}$. At least one delay element 106 is also located in the feedback loop. In some implementation the modulator may receive a first clock signal and may operate to synchronise any signal transitions in the time encoded signal $S_{OUT}$ which is output from the modulator. The signal transitions may be synchronised to a first clock signal CLK1 which is also used by a time-decoding converter so as to ease processing of the time-encoded signal. In addition the at least one delay element may comprise a digital delay elements which is a relatively simple way of provide a controlled delay. In some implementations, the delay applied by the delay element(s) 106 may be controllably varied, either to provide different operating modes and/or in at least one operating mode to allow adaptive variation of the delay in use so as to control variation of the cycle period/frequency of the time-encoded signal. The applied delay may be varied whether or not the time encoded signal is synchronised to a first clock signal, but implementations where a digital delay is used and the time encoded signal is synchronised to the first clock signal, provide a relatively simple way to provide a controlled variation in the applied delay D. In some implementation the comparator may be operable to apply hysteresis H. When the comparator 101 is a hysteretic comparator the extent of any hysteresis applied with contribute to the cycle period of the time encoded signal. Applying both hysteresis H and a delay D in the feedback loop may ease the requirements for the applied delay and/or the hysteretic comparator. In some instances the delay and hysteresis applied may be fixed in use, at least in one operating mode, but in some instances at least one of the delay and/or hysteresis applied may be controllably varied, and in some implementations both the delay and hysteresis applied may be controllably varied, in at least one operating mode. In some embodiment there may be both a controllably variable digital delay and a controllably variable analogue delay.

As a modulator according to embodiments of the disclosure may be small, comprising a simple hysteretic comparator and, for example, a single non-critical RC network together with a small amount of digital circuitry, it may be implemented advantageously in a range of applications where some indication of analogue signal level is desired.

Figure 16:
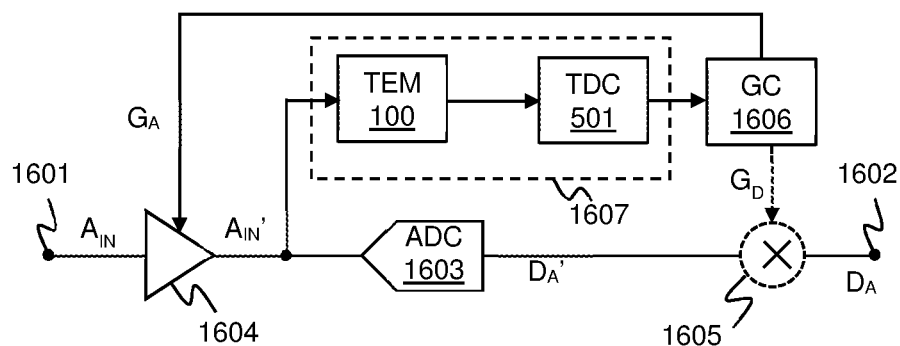
FIG. 16 illustrates an example of a time encoding modulator implemented in a side channel to an audio signal path.

FIG. 16 illustrates one embodiment where a time encoding modulator 100 is implemented as part of a gain control path for a main signal path. FIG. 14 illustrates a main signal path extending between a main path input 1601 and a main path output 1602. The main signal path may for instance be an audio signal path for receiving an input analogue audio signal $A_{IN}$ and outputting a digital audio signal $D_A$. The main signal path comprises an ADC 1603. ADC 1603 may be any suitable type of ADC for the particular application and may for instance be a conventional switched capacitor type ADC or a VCO based ADC or the like. The ADC 1603 may be designed to provide a desired level of precision and noise performance.

The main signal path may also have an analogue variable gain element 1604 for applying a controlled analogue gain $G_A$ to the analogue signal $A_{IN}$ to provide a gained-up signal $A_{IN}'$ that is input to the ADC 1603. The ADC 1603 converts this signal to a corresponding digital signal $D_A'$.

In some embodiments there may additionally be a digital gain element 1605 for applying a controlled digital gain $G_D$ to the digital signal $D_A'$ and outputting a gained-up digital signal $D_A$ 1603. In such embodiments the analogue gain $G_A$ applied may be controlled, according to known dynamic range extension (DRE) techniques, based on a characteristic, feature, indication and/or control of the input signal level so as to maximise the use of an operating range of the ADC 1603. That is, at lower signal levels the analogue gain $G_A$ applied may be increased to provide more amplification/less attenuation than for higher signal levels and vice versa. This maximises the use of input range of the ADC 1603 and improves the signal-to-noise ratio (for quantisation noise) that otherwise would apply for lower signal levels. The digital gain Go may be controlled to substantially reverse at least part of the analogue gain $G_A$ applied and thus may be controlled at least partly inversely to the analogue gain $G_A$. A gain controller 1606 thus controls the analogue and digital gains $G_A$ and $G_D$ accordingly.

For conventional DRE the analogue and digital gains $G_A$ and $G_D$ respectively may be controlled based on a characteristic, feature, indication and/or control of the gained-up input analogue audio signal $A_{IN}'$, for instance by comparing the gained-up input audio signal $A_{IN}'$ to one or more thresholds. However this may only allow relatively coarse control or require a relatively large amount of analogue circuitry. Alternatively a characteristic, feature, indication and/or control of the digital signal $D'_A$ output from the ADC 1603 (or the gain adjusted digital audio signal $D_A$) may be used as an indication of the signal level currently being converted by the ADC. However, as will be understood by one skilled in the art, it is important that for any relatively sudden rises in input signal level, the analogue gain $G_A$ is reduced in time before the signal level reaches a level that would cause clipping at the then-current gain level. This requires the gain controller 1506 to react rapidly to increases in the analogue input signal level $A_{IN}$. For some ADCs there may be a processing latency associated with the conversion from an analogue signal to digital signal that means that the digital output signal $D_A'$ cannot be used for DRE control without setting limits as to when a higher analogue gain $G_A$ can be applied that are quite cautious, which may limit the performance gains realised.

In the embodiment of FIG. 16 the gained up analogue input signal $A_{IN}'$ is tapped from the main signal path and supplied to a time-encoding modulator 100 as a modulator input signal $S_{IN}$. The time encoding modulator outputs a time encoded signal as discussed above, which in this example is supplied to a TDC 501 such as discussed above in relation to FIG. 5. The output from the TDC 501 is provided as a digital signal to the gain controller 1606 which, as discussed may control the analogue and digital gains $G_A$ and $G_D$ accordingly for applying DRE.

Additionally or alternatively the gain controller 1606 may be configured to apply automatic gain control (AGC) techniques. In such a case the indication of the level of the audio signal $A_{IN}$ provided by the TEM 100 and TDC 501 may be used to determine an optimum analogue gain setting $G_A$ for the input audio signal $A_{IN}$ present, so as to provide the maximum output level from the main signal path. In this case the gain controller 1606 may apply some low-pass filtering or other time averaging or attack and decay time constants in order to determine an appropriate analogue gain setting $G_A$. For such applications a digital gain element 1605 may not be present or, if present, may be controlled to a desired digital gain $G_D$ that does not vary with the AGC controlled analogue gain $G_A$.

Such arrangement may be of particular use in applications where occasional clipping of the input may be acceptable but where the SNR achieved is important, such as may be the case for an Always-On-Voice trigger application. Some audio algorithms for performing Always-On Voice detection may not work well with the frequent noise floor modulation that may result from using DRE techniques, whereas a training or start-up sequence to find the optimum gain (which then remains constant or varies only relatively slowly until other system events determine that the training should be rerun) may be acceptable.

In some embodiments the gain controller 1606 may be operable in an AGC mode and also in a DRE mode with the appropriate operation being controlled based on the present use case.

The time-encoding modulator 100 together with the TDC 501 thus effectively provide another ADC 1607 in a side-path to the main signal path. This additional ADC 1607 is provided for gain control. Conventionally one would not seek to implement an additional ADC for controlling gain applied to another ADC. However the time encoding modulator 100 according to embodiments of the invention can be implemented by small and low power circuitry, as can the TDC 501 and thus such an embodiment provides a very small and power efficient ADC 1607 for a side channel that has sufficient performance and low latency, for instance to allow control of DRE for ADC 1603 in the main signal path. The ADC 1603 of the main signal path may be a relatively large circuit and/or may have higher power consumption and/or higher latency in comparison to the side path ADC 1407. The side path ADC 1607 may allow for better gain control thus maximising the performance of the main path ADC 1603.

It should be noted that the analogue gain element 1604 and digital gain element 160 are illustrated as separate components to the main path ADC 1603 for ease of explanation. These elements may be separate to the ADC 1603 but in some implementations the controlled digital or analogue gain elements 1604 and 160 respectively may be combined with the input or output stages, respectively, of the ADC 1603.

Embodiments may be implemented in a range of applications and in particular are suitable for audio applications. Embodiments are also useful for instrumentation sensing, for instance for sensing parameters of transducers, e.g. for sensing a return current for speaker protection and/or sensing a return current or voltage for monitoring haptics transducers such as linear resonant actuator.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A time-encoding modulator comprising:
   a forward signal path from a modulator input for receiving an input signal and a modulator output for outputting a time encoded signal;
   a feedback path forming a feedback loop with at least part of the forward signal path;
   a comparator located in the forward signal path within the feedback loop;
   a filter located within the feedback loop;
   a delay element for applying a controlled delay within the feedback loop; and
   a latching element within the forward signal path, the latching element being configured to receive a first clock signal and to synchronise any signal transitions output from the latching element to the first clock signal such that any signal transitions in the output from the modulator are synchronised to the first clock signal;
   wherein the delay element comprises a digital delay element which is synchronised to the first clock signal.

2. A time-encoding modulator as claimed in claim 1 wherein the comparator is a latched comparator comprising said latching element.

3. A time-encoding modulator as claimed in claim 1 wherein the digital delay element is in the forward signal path and is a latched digital delay element comprising said latching element.

4. A time-encoding modulator as claimed in claim 1 where the digital delay element comprises a delay element counter clocked by the first clock signal, wherein the digital delay element is configured such that, in response to a signal transition at an input to the digital delay element, the delay element counter is configured to count for a defined number of clock periods before a corresponding signal transition at an output of the digital delay element.

5. A time-encoding modulator as claimed in claim 1 where the digital delay element comprises a tapped delay line.

6. A time-encoding modulator as claimed in claim 1 further comprising a cycle period controller for controlling at least one parameter of the modulator so as to control a cycle period of the time-encoded signal.

7. A time-encoding modulator as claimed in claim 6 wherein the cycle period controller is configured to control the modulator based on the time-encoded signal.

8. A time-encoding modulator as claimed in claim 6 further comprising a time-to-digital-converter configured to receive the time-encoded signal and output a digital control signal based on the time-encoded signal, wherein the cycle period controller is configured to receive the digital control signal.

9. A time-encoding modulator as claimed in claim 6 wherein the cycle period controller is configured to control said at least one parameter of the modulator so as to maintain a cycle period of the time encoded signal within a defined range on a cycle-by-cycle basis.

10. A time-encoding modulator as claimed in claim 9 wherein the cycle period controller is configured control said at least one parameter of the modulator so as to dither the cycle period.

11. A time-encoding modulator as claimed in claim 6 wherein the time-encoding modulator is operable in a first mode with a limit cycle frequency, for a quiescent input signal, equal to a first frequency and also in a second mode with a limit cycle frequency equal to a second different frequency, and wherein the cycle period controller is operable to control the modulator parameter so as to implement the first and second modes.

12. A time-encoding modulator as claimed in claim 6 wherein the digital delay element comprises a variable delay element for applying a controllably variable delay and said at least one parameter of the modulator controlled by the timing controller comprises the delay applied by the variable delay element.

13. A time-encoding modulator as claimed in claim 12 where the digital delay element comprises:
   a delay element counter clocked by the first clock signal and responsive to a signal transition at an input to the digital delay element to start counting from an initial count value; and
   a digital comparator for receiving a count value from the delay element counter and triggering a signal transition at an output of the digital delay element when the count value differs from an initial count value by an amount defined by a reference value;
   wherein the cycle period controller is configured to control said defined reference value.

14. A time-encoding modulator as claimed in claim 6 wherein the comparator is operable as a hysteretic comparator to apply a defined amount of hysteresis and said at least one parameter of the modulator controlled by the cycle period controller comprises the amount of hysteresis applied by the hysteretic comparator.

15. A time-encoding modulator as claimed in claim 6 further comprising a variable analogue delay element for applying a controllably variable delay and said at least one parameter of the modulator controlled by the cycle period controller comprises the delay applied by the variable analogue delay element.

16. A time-encoding modulator as claimed in claim 1 wherein the comparator is operable as a hysteretic comparator to apply a defined amount of hysteresis.

17. A time-encoding modulator as claimed in claim 1 wherein the filter is located in the feedback path and the input signal is supplied to a first input of the comparator and a filtered signal output from the filter is supplied to a second input of the comparator.

18. A time-encoding modulator as claimed in claim 17 wherein the filter comprises:
   a current generator configured to receive the feedback signal and to generate a controlled current signal having a first defined current during periods of a first output state and a second defined current during periods of a second output state; and
   a capacitor configured to be charged and discharged by the controlled current signal.

19. A time-encoding modulator as claimed in claim 1 wherein a feedback signal from the feedback path is combined with the input signal and filtered by the filter and a filtered signal output from the filter is supplied to a first input of the comparator to be compared to a defined reference.

20. A time-encoding modulator as claimed in claim 19 wherein the feedback path comprises at least one current generator configured to receive the feedback signal and to generate a controlled current signal having a first defined current during periods of a first output state and a second defined current during periods of a second output state, wherein said controlled current signal is combined with the input signal.

21. A modulator circuit comprising a time-encoding modulator as claimed in claim 1 and a first counter, wherein the first counter is configured to receive the time encoded signal and generate count values of the number of clock periods of a second clock signal during periods defined by the time encoded signal, wherein the second clock signal is synchronised to the first clock signal.

22. A modulator circuit comprising a time-encoding modulator as claimed in claim 1; and a demodulator comprising:
   a numerically controlled oscillator configured to receive the time encoded signal and generate an oscillator signal with a that controllably varies based on the time encoded signal; and
   a demodulator counter configured to receive the oscillator signal and count a number of oscillations of the oscillator signal in each of a succession of count periods.

23. A modulator circuit comprising a time-encoding modulator as claimed in claim 1; and a demodulator comprising:
   a demodulator counter configured to receive an oscillation signal and count the number of oscillations of the oscillation during periods of a first signal level of the time encoded signal and configured not to count during periods of a second signal level of the time encoded signal.

24. A time-encoding modulator for receiving an input signal and outputting a time encoded signal comprising:
   a comparator and a filter arranged in a feedback loop of the modulator to generate the time encoded signal based on the input signal; and
   at least one delay element for applying a controlled delay within the feedback loop,
   wherein the delay element is a digital element clocked by a first clock signal.

* * * * *

UNITED STATES PATENT AND TRADEMARK OFFICE
CERTIFICATE OF CORRECTION

PATENT NO. : 10,348,282 B1
APPLICATION NO. : 16/050762
DATED : July 9, 2019
INVENTOR(S) : John Paul Lesso It is certified that error appears in the above-identified patent and that said Letters Patent is hereby corrected as shown below:

In the Specification

In Column 6, Line 40, delete "illustrates" and insert -- illustrate --, therefor.

In Column 39, Line 38, delete "160" and insert -- 1605 --, therefor.

In Column 39, Line 42, delete "160" and insert -- 1605 --, therefor.

In the Claims

Column 42, Lines 35-44 should read:
22. A modulator circuit comprising a time-encoding modulator as claimed in claim 1; and a
    demodulator comprising:
        a numerically controlled oscillator configured to receive the time encoded signal and generate
            an oscillator signal with a frequency that controllably varies based on the time
            encoded signal; and
        a demodulator counter configured to receive the oscillator signal and count a number of
            oscillations of the oscillator signal in each of a succession of count periods.

Signed and Sealed this
Seventeenth Day of December, 2019

Andrei Iancu
*Director of the United States Patent and Trademark Office*